United States Patent
Kawasumi

(10) Patent No.: US 9,368,228 B2
(45) Date of Patent: Jun. 14, 2016

(54) SEMICONDUCTOR MEMORY

(71) Applicant: KABUSHIKI KAISHA TOSHIBA, Minato-ku (JP)

(72) Inventor: Atsushi Kawasumi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/482,402

(22) Filed: Sep. 10, 2014

(65) Prior Publication Data

US 2015/0138866 A1 May 21, 2015

(30) Foreign Application Priority Data

Nov. 19, 2013 (JP) .................................. 2013-239088

(51) Int. Cl.
*G11C 11/419* (2006.01)
*G11C 11/417* (2006.01)
*G11C 5/14* (2006.01)
*G11C 5/06* (2006.01)
*G11C 7/10* (2006.01)
*G11C 17/18* (2006.01)
*G11C 17/16* (2006.01)
(Continued)

(52) U.S. Cl.
CPC ................ *G11C 17/18* (2013.01); *G11C 17/08* (2013.01); *G11C 17/16* (2013.01); *G11C 29/06* (2013.01); *G11C 29/42* (2013.01); *G11C 29/52* (2013.01); *G11C 5/06* (2013.01); *G11C 5/14* (2013.01); *G11C 7/12* (2013.01); *G11C 8/08* (2013.01); *G11C 11/1673* (2013.01); *G11C 11/4074* (2013.01); *G11C 11/417* (2013.01); *G11C 11/5642* (2013.01)

(58) Field of Classification Search
CPC .. G11C 11/5642; G11C 5/06; G11C 11/1673; G11C 11/417; G11C 7/12; G11C 8/08; G11C 11/4074
USPC ........................ 365/154, 155, 156, 63, 189.11
See application file for complete search history.

(56) References Cited

U.S. PATENT DOCUMENTS 5,150,325 A * 9/1992 Yanagisawa ....... G11C 11/4085
365/177
5,949,731 A * 9/1999 Tsukude .................. G11C 5/00
365/149

(Continued)

FOREIGN PATENT DOCUMENTS

JP 2006-191122 7/2006
JP 2006-252639 9/2006

(Continued)

*Primary Examiner* — Ly D Pham
(74) *Attorney, Agent, or Firm* — Oblon, McClelland, Maier & Neustadt, L.L.P.

(57) ABSTRACT

According to an embodiment, a semiconductor memory includes word lines, a plurality of sets of a pair of bit lines, memory cells, a writing/reading circuit, and a word line selection circuit. In a state where inverted data of program data has been written to the memory cells, a stress is applied and the program data is programmed to the memory cells. The writing/reading circuit writes the inverted data of the same program data to a unit memory cell group made of memory cells connected to a set of a pair of bit lines at a time of programming, and reads data from the unit memory cell group by detecting a signal level of the pair of bit lines at a time of reading. The word line selection circuit simultaneously selects and drives two or more word lines of the word lines connected to the unit memory cell group.

6 Claims, 21 Drawing Sheets

(51) Int. Cl.
  *G11C 17/08*  (2006.01)
  *G11C 29/06*  (2006.01)
  *G11C 29/42*  (2006.01)
  *G11C 29/52*  (2006.01)
  *G11C 7/12*  (2006.01)
  *G11C 8/08*  (2006.01)
  *G11C 11/4074*  (2006.01)
  *G11C 11/16*  (2006.01)
  *G11C 11/56*  (2006.01)

(56) References Cited

U.S. PATENT DOCUMENTS

| | | | |
|---|---|---|---|
| 6,551,846 B1 * | 4/2003 | Furutani | H01L 22/34 257/48 |
| 7,760,537 B2 | 7/2010 | Urakawa | |
| 8,018,757 B2 | 9/2011 | Kawasumi et al. | |
| 8,077,499 B2 | 12/2011 | Kawasumi et al. | |
| 2010/0202183 A1 * | 8/2010 | Kurjanowicz | G11C 17/18 365/94 |
| 2012/0326224 A1 | 12/2012 | Kawanaka et al. | |
| 2012/0327724 A1 * | 12/2012 | Kawakubo | G11C 8/08 365/189.07 |

FOREIGN PATENT DOCUMENTS

| | | |
|---|---|---|
| JP | 2007-26475 | 2/2007 |
| JP | 2009-9682 | 1/2009 |
| JP | 2010-49770 A | 3/2010 |
| JP | 2010-55653 A | 3/2010 |
| JP | 2013-8801 A | 1/2013 |

* cited by examiner (a)

(b)

(a)

(b)

SEMICONDUCTOR MEMORY

CROSS REFERENCE TO RELATED APPLICATION

This application is based upon and claims the benefit of priority from the prior Japanese Patent Application No. 2013-239088 filed on Nov. 19, 2013 in Japan, the entire contents of which are incorporated herein by reference.

FIELD

Embodiments described herein relate generally to a semiconductor memory.

BACKGROUND

Conventionally, one time programmable ROMs (OTP) to which data is programmable only one time are known as a programmable ROM. As an example of the OTPs, a semiconductor memory in which a threshold of a field effect transistor that configures a static RAM (SRAM) is varied by negative bias threshold instability (NBTI), and data is programmed with the variation is known.

In such a semiconductor memory, there is a failure due to programming of data using the NBTI, such as a stochastic failure of the programming.

DETAILED DESCRIPTION

According to an embodiment, a semiconductor memory includes a plurality of word lines, a plurality of sets of a pair of bit lines, a plurality of memory cells, a writing/reading circuit, and a word line selection circuit. The plurality of sets of a pair of bit lines intersects with the plurality of word lines. The plurality of memory cells is provided at intersection portions of the plurality of word lines and each of the plurality of sets of a pair of bit lines. In a state where inverted data of program data has been written to the memory cells, a stress is applied and the program data is programmed to the memory cells. The writing/reading circuit is configured to write the inverted data of the same program data to a unit memory cell group made of a plurality of memory cells connected to a set of a pair of bit lines at a time of programming, and to read data from the unit memory cell group connected to the pair of bit lines by detecting a signal level of the pair of bit lines at a time of reading. The word line selection circuit is configured to simultaneously select and drive two or more word lines of the plurality of word lines connected to the unit memory cell group to which programming has been performed, at the time of reading.

Embodiments will now be explained with reference to the accompanying drawings.

First Embodiment

One of characteristics of a first embodiment is to simultaneously select a plurality of word lines at the time of reading.

Figure 1:
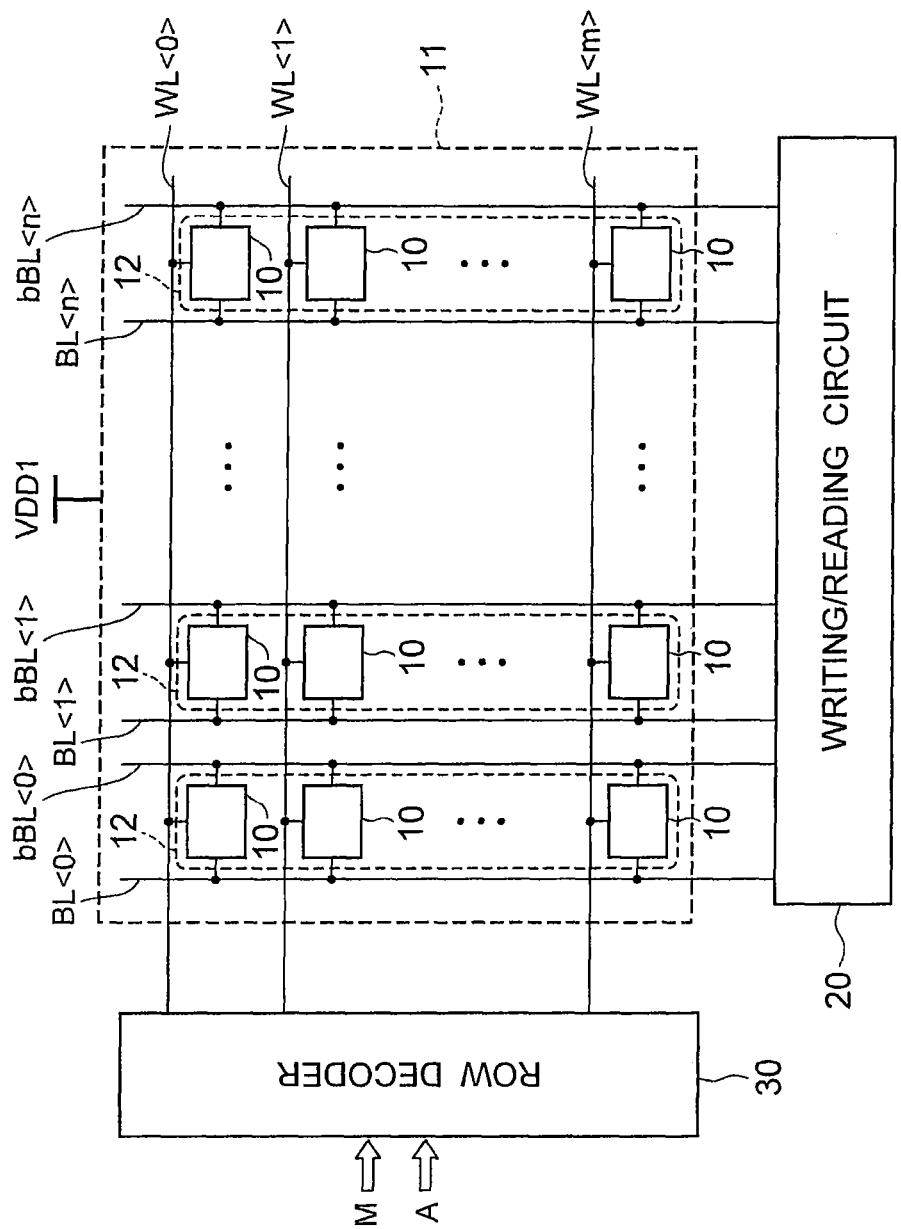
FIG. 1 is a block diagram illustrating a schematic configuration of a semiconductor memory according to a first embodiment.

FIG. 1 is a block diagram illustrating a schematic configuration of a semiconductor memory according to the first embodiment. As illustrated in FIG. 1, the semiconductor memory includes a plurality of word lines WL <0> to WL <m> (m is a positive integer), a plurality of sets of a pair of bit lines BL <0> and bBL <0> to BL <n> and bBL <n> (n is a positive integer) that intersects with the plurality of word lines, a plurality of memory cells 10, a writing/reading circuit 20, and a row decoder (word line selection circuit) 30.

The plurality of memory cells 10 is provided at intersection portions of the plurality of word lines WL <0> to WL <m> and each of the plurality of sets of a pair of bit lines BL <0> and bBL <0> to BL <n> and bBL <n>. That is, the plurality of memory cells 10 is arranged in a word line direction and in a bit line direction in a matrix manner to configure a memory cell array 11. As described below, a stress is applied to the plurality of memory cells 10 in a state where inverted data of program data has been written, and the program data is programmed. A first power source voltage VDD1 is applied to the plurality of memory cells 10.

The writing/reading circuit 20 writes inverted data of the same program data to a unit memory cell group 12 made of the plurality of memory cells 10 connected to a set of a pair of bit lines according to an address signal at the time of programming. The address signal and the program data are supplied to the writing/reading circuit 20 from an outside.

The writing/reading circuit 20 reads data from the unit memory cell group 12 connected to a pair of bit lines by detecting a signal level of the pair of bit lines according to the address signal at the time of reading.

The row decoder 30 simultaneously selects and drives two or more word lines of the plurality of word lines WL <0> to WL <m> connected to the unit memory cell group 12 to which programming has been performed, according to an address signal A and a multiple selection signal M, at the time of reading. That is, the row decoder 30 performs multiple selects of the word lines.

A second power source voltage VDD2 is supplied to the writing/reading circuit 20 and the row decoder 30.

Figure 2:
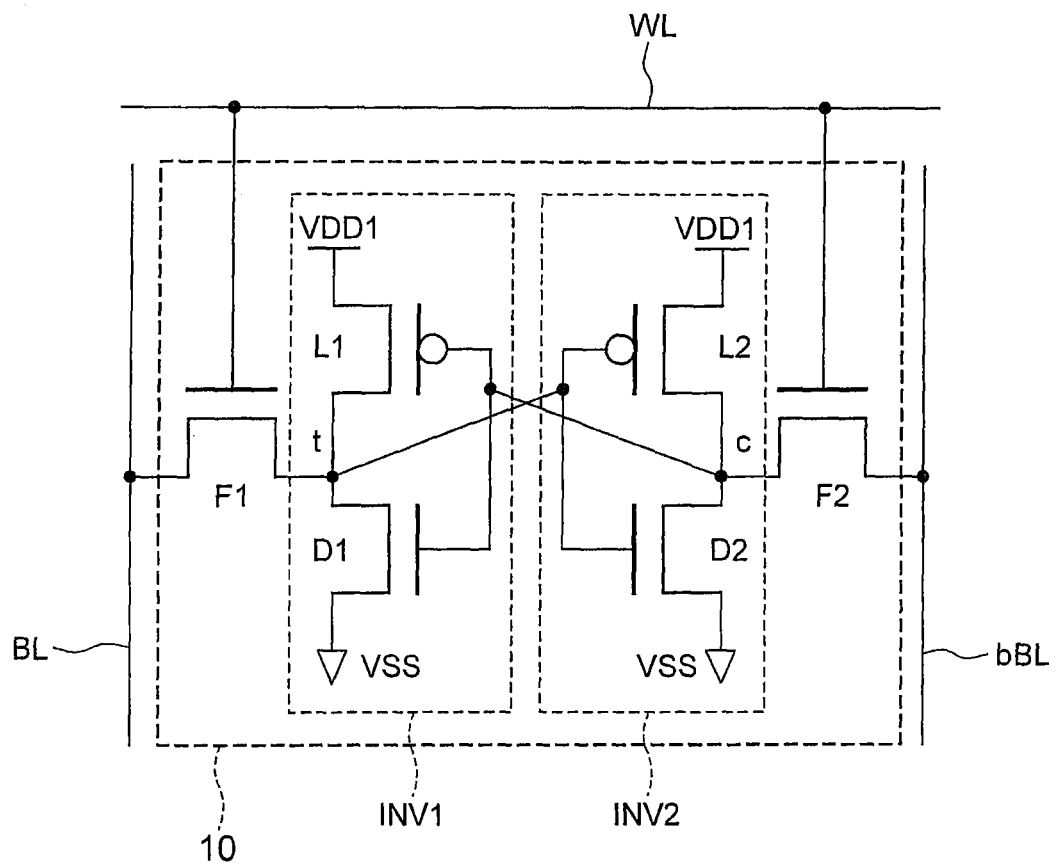
FIG. 2 is a circuit diagram of the memory cell according to the first embodiment.

FIG. 2 is a circuit diagram of the memory cell 10 according to the first embodiment. As illustrated in FIG. 2, the memory cell 10 includes a pair of drive transistors D1 and D2, a pair of load transistors L1 and L2, and a pair of transmission transistors F1 and F2. The load transistors L1 and L2 are P channel MOS type field effect transistors (hereinafter, referred to as PMOS transistors), and the drive transistors D1 and D2 and the transmission transistors F1 and F2 are N channel MOS type field effect transistors (hereinafter, referred to as NMOS transistors). The first power source voltage VDD1 is supplied to sources of the load transistors L1 and L2. A ground voltage VSS is supplied to sources of the drive transistors D1 and D2.

The drive transistor D1 and the load transistor L1 are connected in series to configure a first inverter INV1. The drive transistor D2 and the load transistor L2 are connected in series to configure a second inverter INV2. Then, outputs and inputs of a pair of the inverters INV1 and INV2 are mutually cross-coupled, so that a flip-flop is configured. That is, each of the memory cells 10 includes the cross-coupled first inverter INV1 and second inverter INV2. A connection point of a drain of the drive transistor D1 and a drain of the load transistor L1 configures a storage node t, and a connection point of a drain of the drive transistor D2 and a drain of the load transistor L2 configures a storage node c.

Each of the word lines WL <0> to WL <m> is commonly connected with gates of the transmission transistors F1 and F2 of a corresponding memory cell 10.

Further, each of the bit lines BL <0> to BL <n> is connected with a gate of the drive transistor D2, a gate of the load transistor L2, a drain of the drive transistor D1, and a drain of the load transistor L1 through the transmission transistor F1 in a corresponding memory cell 10. Further, each of the bit lines bBL <0> to bBL <255> is connected with a drain of the drive transistor D2, a drain of the load transistor L2, a gate of the drive transistor D1, and a gate of the load transistor L1 through the transmission transistor F2 in a corresponding memory cell 10.

As described above, the configuration of the memory cell 10 is the same as that of an SRAM cell as a general-purpose memory. However, the memory cell 10 is different from the SRAM cell as a general-purpose memory in that the first power source voltage VDD1 is higher than the second power source voltage VDD2.

Further, programming of program data is performed by making of thresholds of the load transistors L1 and L2 different. That is, a magnitude relationship between the thresholds of the load transistors L1 and L2 is determined according to the program data. As a state after the programming, the thresholds of the load transistors L1 and L2 are different.

Figure 3:
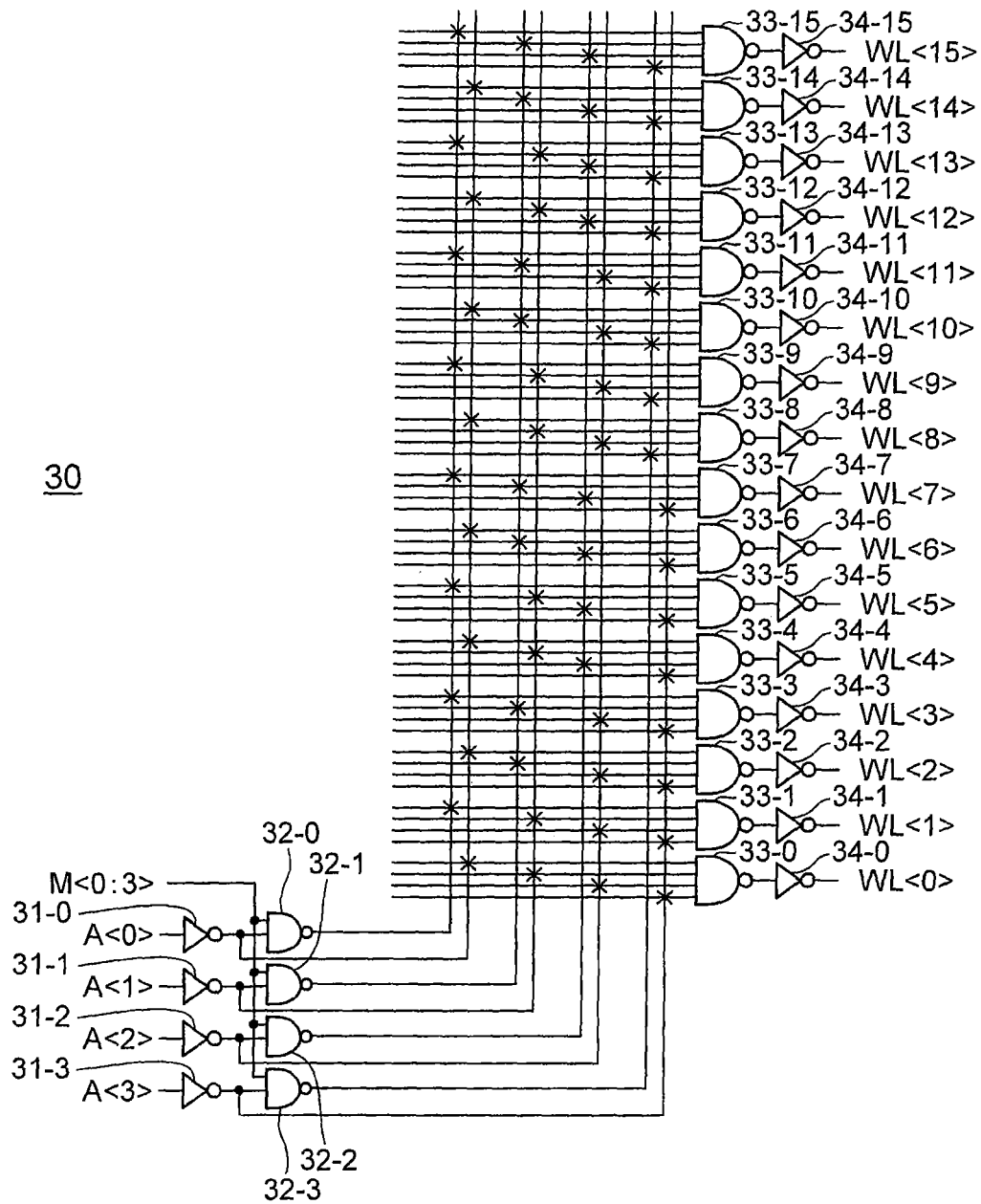
FIG. 3 is a circuit diagram of the row decoder according to the first embodiment.

FIG. 3 is a circuit diagram of the row decoder 30 according to the first embodiment. Here, for clarifying the description, an example of selecting the word lines WL <0> to WL <15> by 4-bit address signals A <0:3> and multiple selection signals M <0:3> will be described.

As illustrated in FIG. 3, the row decoder 30 includes inverters 31-0 to 31-3, NAND circuits 32-0 to 32-3, NAND circuits 33-0 to 33-15, and inverters 34-0 to 34-15.

Corresponding address signals A <0> to A <3> are input to the inverters 31-0 to 31-3, respectively. Output signals of corresponding inverters 31-0 to 31-3 and corresponding multiple selection signals M <0> to M <3> are input to the NAND circuits 32-0 to 32-3, respectively.

The output signal of the inverter 31-0 is input to the NAND circuits 33-0, 33-2, 33-4, 33-6, 33-8, 33-10, 33-12, and 33-14.
The output signal of the inverter 31-1 is input to the NAND circuits 33-0, 33-1, 33-4, 33-5, 33-8, 33-9, 33-12, and 33-13.
The output signal of the inverter 31-2 is input to the NAND circuits 33-0 to 33-3, and 33-8 to 33-11. The output signal of the inverter 31-3 is input to the NAND circuits 33-0 to 33-7.

An output signal of the NAND circuit 32-0 is input to the NAND circuits 33-1, 33-3, 33-5, 33-7, 33-9, 33-11, 33-13, and 33-15. An output signal of the NAND circuit 32-1 is input to the NAND circuits 33-2, 33-3, 33-6, 33-7, 33-10, 33-11, 33-14, and 33-15. An output signal of the NAND circuit 32-2 is input to the NAND circuits 33-4 to 33-7, and 33-12 to 33-15. An output signal of the NAND circuit 32-3 is input to the NAND circuits 33-8 to 33-15.

Output signals of the NAND circuits 33-0 to 33-15 are input to corresponding inverters 34-0 to 34-15, respectively. Output signals of the inverters 34-0 to 34-15 are output to corresponding word lines WL <0> to WL <15>, respectively.

Note that an existing row decoder used for an SRAM as a general-purpose memory is different from the row decoder 30 of FIG. 3 in that the multiple selection signals M <0:3> are not used and the NAND circuits 32-0 to 32-3 are not provided.

When all of the multiple selection signals M <0:3> are "1", the row decoder 30 selects a word line one by one according to the address signals A <0:3>, similarly to the existing row decoder.

In contrast, when the multiple selection signal M <i> (i is 0, 1, 2, 3) is "0", and the address signal A <i> is fixed to "0", an address classified with the address signal A <i> is degenerated. That is, the word line classified with the address signal A <i> is always in a selected state.

As described above, the row decoder 30 can perform multiple selects of an arbitrary number of word lines according to the multiple selection signals M <0:3> and the address signals A <0:3>.

Program Operation

Next, a program operation of program data with respect to a semiconductor memory will be described. This program operation is controlled by a control circuit (not illustrated) provided outside or inside the semiconductor memory, for example.

First, the writing/reading circuit 20 writes inverted data of the same program data to one unit memory cell group 12 specified by the address signal. Here, an example of writing inverted data "0" of program data "1" to the unit memory cell group 12 connected to the pair of bit lines BL <0> and bBL <0> will be described.

This writing is similarly performed to the writing to an SRAM cell as a general-purpose memory.

For example, a voltage of the word line WL <0> is made "1" (=VDD2) and the transmission transistors F1 and F2 are turned ON in a state where the first power source voltage VDD1 is supplied to the plurality of memory cells 10.

Then, a voltage of the bit line BL <0> is made "0" (=VSS), and a voltage of the bit line bBL <0> is made "1".

At this time, data of the bit line BL <0>, bBL <0> is latched to the memory cell 10 connected to the word line WL <0>.

Next, the voltage of the word line WL <0> is made "0". Accordingly, the inverted data "0" of the program data "1" is written to the memory cell 10. That is, a state in which an input signal of the first inverter INV1 (a signal of the storage node c) in the memory cell 10 is "1", and an input signal of the second inverter INV2 (a signal of the storage node t) is "0" is maintained.

Then, other word lines WL <1> to WL <m> are made "1" one by one, and the inverted data "0" is similarly written to other memory cells 10 of the unit memory cell group 12.

Note that the word lines WL <0> to WL <m> are simultaneously made "1", and the inverted data "0" may be simultaneously written to all of the memory cells 10 of the unit memory cell group 12. That is, the row decoder 30 may perform multiple selects of the word lines at the time of writing.

Next, the inverted data of the program data is written to the unit memory cell group 12 connected to another pair of bit lines.

Note that, at the time of this writing, the second power source voltage VDD2 may be supplied to the plurality of memory cells 10 instead of the first power source voltage VDD1.

Next, a stress is applied to the plurality of memory cells 10 in a state where the inverted data of the program data has been written to a desired unit memory cell group 12.

For example, the first power source voltage VDD1 is applied to the plurality of memory cells 10 of the unit memory cell group 12 as the stress for a fixed period, in a state where the voltages of the word lines WL <0> to WL <m> are made "0" and the transmission transistors F1 and F2 are turned OFF, and the voltages of a pair of bit lines are made "0".

At this time, in each of the memory cells 10 connected to the pair of bit lines BL <0> and bBL <0>, a gate voltage of the load transistor L2 of the second inverter INV2 is "0", and thus a high voltage (=the first power source voltage VDD1) is applied between the gate and source of the load transistor L2. During a period in which the high voltage is applied, shift of a threshold of the load transistor L2 by NBTI becomes remarkable. To be specific, the threshold of the load transistor L2 is increased.

As described above, a threshold of a transistor in which the gate signal is "0" becomes higher than a threshold of a transistor where the gate voltage is "1", between the load transistors L1 and L2.

To accelerate the NBTI, the temperature of a semiconductor chip may be set to a temperature higher than room temperature. Further, to accelerate the NBTI, the first power source voltage VDD1 may be supplied to a semiconductor area (for example, an N well) where the load transistors L1 and L2 are formed.

In this application of a stress, the data written in the plurality of memory cells 10 is not changed. However, substantially, the program data "1" has been programmed to the plurality of memory cells 10 of the unit memory cell group 12 connected to the pair of bit lines BL <0> and bBL <0>, for example.

Following that, when the supply of the first and second power source voltages VDD1 and VDD2 is stopped, the inverted data of the program data written to the plurality of memory cells 10 is erased.

As described above, in the present embodiment, the plurality of memory cells 10 is used to program one-bit program data.

Reading Operation

Next, a reading operation of the program data programmed by the above-described program operation will be described.

Here, a reading operation from the unit memory cell group 12 will be described on the assumption that "1" has been programmed to the plurality of memory cells 10 of the unit memory cell group 12 connected to the pair of bit lines BL <0> and bBL <0>.

First, the first power source voltage VDD1 is supplied to the plurality of memory cells 10.

As described above, in each of the memory cells 10, the thresholds of the load transistors L1 and L2 are different. The threshold of the load transistor L2 is higher than the threshold of the load transistor L1.

Due to an imbalance of the thresholds, in an initial state of each of the memory cells 10 at the time when the first power source voltage VDD1 is supplied, an input signal of the second inverter INV2 becomes "1", and an input signal of the first inverter INV1 becomes "0". This is a state in which the program data "1" has been programmed to each of the memory cells 10.

Next, the second power source voltage VDD2 is supplied.

Next, the row decoder 30 simultaneously selects and drives two or more word lines of the plurality of word lines WL <0> to WL <m> connected to the unit memory cell group 12 to which the programming has been performed.

The writing/reading circuit 20 reads the program data "1" from the unit memory cell group 12 connected to the pair of bit lines BL <0> and bBL <0> by detecting the signal level of the pair of bit lines BL <0> and bBL <0>.

Here, a stochastic failure of the programming using the NBTI will be described.

Figure 4:
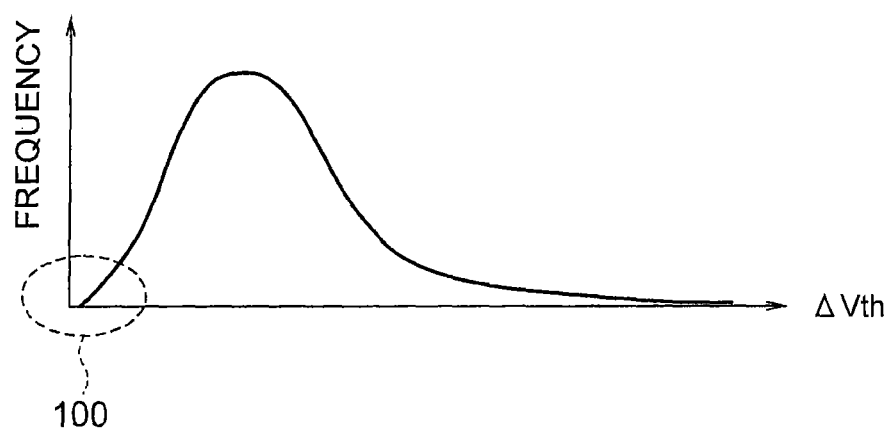
FIG. 4 is a diagram illustrating a relationship between a shift amount ΔVth of a threshold and frequency when a stress is applied to a PMOS transistor.

FIG. 4 is a diagram illustrating a relationship between a shift amount ΔVth of a threshold and frequency when a stress is applied to a PMOS transistor.

As illustrated in a region 100 of FIG. 4, a PMOS transistor having little shift (increase) of the threshold when a stress is applied stochastically exists. Therefore, the programming is stochastically failed. To handle the failure of the programming, use of an ECC circuit that performs error detection/correction can be considered. However, an ECC circuit has a large area.

Here, according to the first embodiment, the same program data is programmed to the plurality of memory cells 10 of the unit memory cell group 12, and two or more word lines are simultaneously selected at the time of reading. Accordingly, data to be read is determined by majority of the program data programmed to the selected memory cells 10.

That is, in a certain unit memory cell group 12, even if programming to the memory cell 10 that includes a PMOS transistor having little shift of the threshold has been failed, correct program data can be read if the programming to more than half the number of the memory cells 10 has been succeeded. That is, error correction is performed. Error correction capability becomes higher as the number of simultaneously selected word lines is larger, and a failure probability can be decreased.

Note that, when two word lines are selected, even if the programming to one of selected memory cells 10 has been failed, the correct program data can be read if the programming to the other memory cell 10 has been succeeded, and the failure probability can be decreased to about ½.

Further, the row decoder of the semiconductor memory that programs data using existing NBTI is mainly changed, so that the semiconductor memory of the present embodiment can be easily realized, and addition of other circuits is unnecessary. Further, the area of one memory cell 10 is sufficiently smaller than peripheral circuits of the writing/reading circuit 20, and the like. Therefore, even if the plurality of memory cells 10 is used in order to program one-bit program data, an increase in the area is small. Therefore, the area of the semiconductor memory can be made smaller than a case where an ECC circuit is used.

Note that, in a case where a large area is allowed, an ECC circuit that detects and corrects an error of data read from the plurality of unit memory cell groups 12 may be included, in addition to the configuration of the first embodiment. With the configuration, the failure probability can be further decreased.

Second Embodiment

Prior to description of a second embodiment, a failure with time that is likely to occur in a memory cell programmed using NBTI, which is known by the inventor, will be described.

Figure 5:
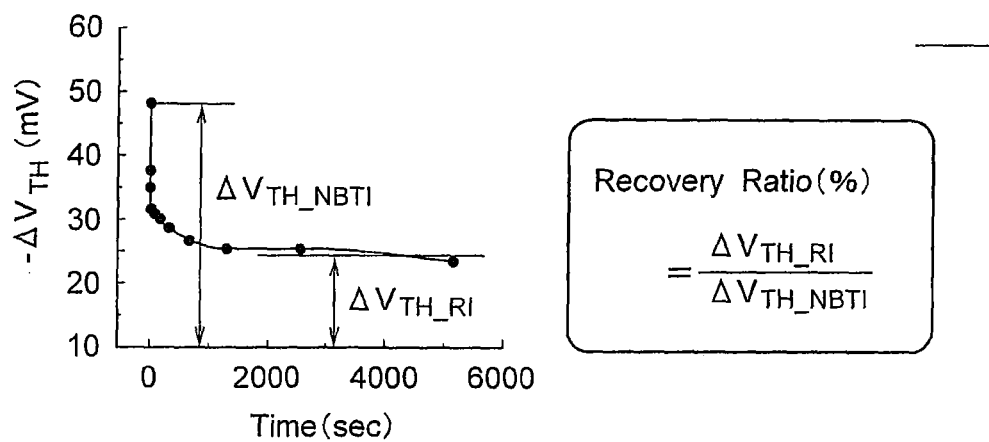
FIG. 5(a) is a diagram illustrating a change with time of a shift amount ΔVth of a threshold of a PMOS transistor by NBTI.
FIG. 5(b) is a diagram illustrating gate voltage dependency characteristics of a recovery ratio of the PMOS transistor.
Figure 5:
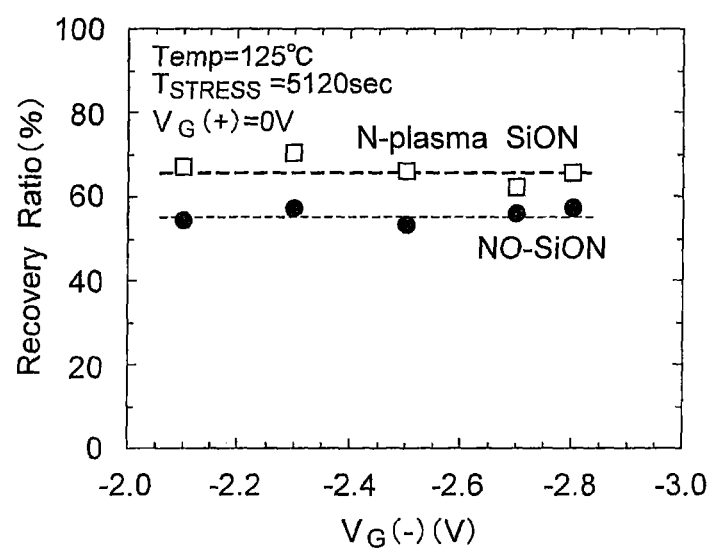

FIG. 5(*a*) is a diagram illustrating a change with time of a shift amount ΔVth of a threshold of a PMOS transistor by NBTI, and FIG. 5(*b*) is a diagram illustrating gate voltage dependency characteristics of a recovery ratio of the PMOS transistor.

As illustrated in FIG. 5(*a*), immediately after the threshold is shifted by the NBTI at a time 0, the shift amount ΔVth of the threshold is decreased with time, and gradually approaches a fixed value.

Here, a value obtained by dividing of a shift amount $\Delta V_{TH\_RI}$ of the threshold after a predetermined time after the threshold is shifted by a shift amount $\Delta V_{TH\_NBTI}$ of the threshold immediately after the threshold is shifted is defined as a recovery ratio.

As illustrated in FIG. 5(*b*), the recovery ratio is slightly different according to a manufacturing process, and is slightly changed according to the gate voltage. However, the recovery ratio roughly falls within a range of 50 to 70%.

Due to such a phenomenon, the program data in the memory cell may be inverted with time.

Further, when the program data is continuously held in the memory cell, the threshold of the other load transistor at an opposite side to a one load transistor, the threshold of which has been shifted by the program, is shifted by NBTI. Due to such a phenomenon, the program data in the memory cell may also be inverted with time.

To handle such a failure with time, in the second embodiment, the following initial test is performed prior to normal use, for example, before shipping.

To be specific, at the time of the initial test, the row decoder 30 selects and drives word lines, the number of which is less than the number of word lines to be selected at the time of reading after the initial test. That is, in the second embodiment, the function of the row decoder 30 is different from the first embodiment. Other configurations are the same as that of the first embodiment, and thus illustration and description are omitted.

Here, description will be given on the assumption that the row decoder 30 selects two word lines at the time of the initial test, and selects three or more word lines at the time of reading.

Before the initial test, program data is programmed to a plurality of memory cells 10 in a similar procedure to the first embodiment.

At the initial test, a writing/reading circuit 20 reads the program data from two memory cells 10 selected in the two word lines in a unit memory cell group 12. When at least one of the two selected memory cells 10 has a failure, data different from the program data is read.

Therefore, for example, an external test circuit determines whether the read data coincides with the programmed program data, and detects a failure when the read data does not coincide. The two memory cells 10 from which the failure has been detected are excluded so that they are not used in normal use.

Then, the above procedure is performed with respect to other memory cells 10.

As described above, according to the present embodiment, the number of simultaneously selected word lines is small at the initial test, and thus error correction capability is low. Therefore, when there is a failure with time, error correction cannot be made and the failure can be detected. Therefore, the memory cells 10 in which a failure with time has occurred can be excluded.

Further, at the time of reading after the initial test, the number of simultaneously selected word lines is large, and thus the error correction capability by majority determination is high. Therefore, even if a failure with time occurs in a memory cell 10 that has not had a failure with time at the time of the initial test, error correction can be made, and correct program data can be read.

Third Embodiment

A third embodiment handles a failure with time by a method different from the second embodiment.

Figure 6:
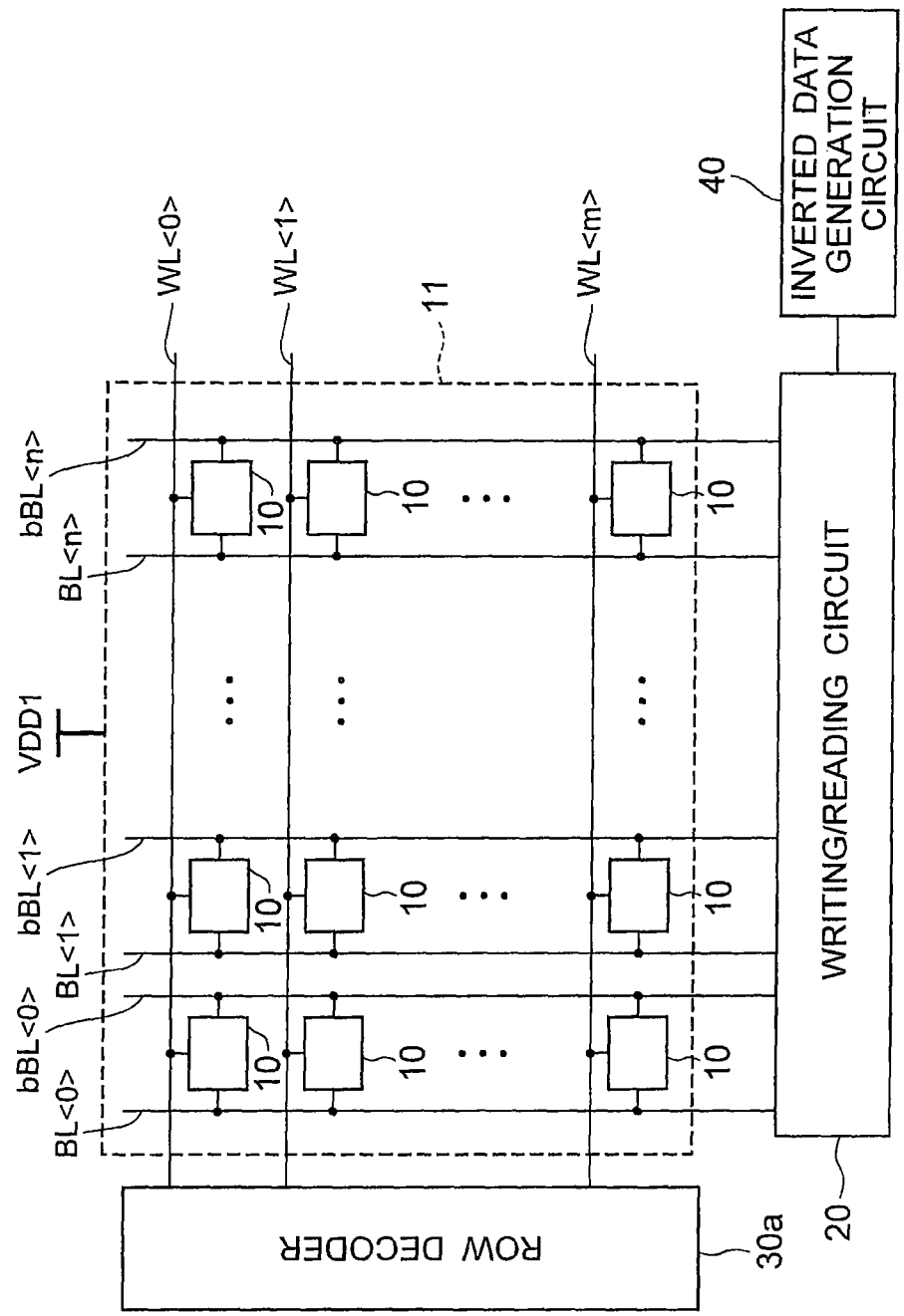
FIG. 6 is a block diagram illustrating a schematic configuration of a semiconductor memory according to a third embodiment.

FIG. 6 is a block diagram illustrating a schematic configuration of a semiconductor memory according to the third embodiment. As illustrated in FIG. 6, the semiconductor memory includes an inverted data generation circuit 40, in addition to the configuration of FIG. 1. Further, a row decoder 30*a* selects one word line at a time, which is different from the first embodiment. That is, in the present embodiment, an example without having majority determination will be described. Other configurations are the same as those of FIG. 1. Thus the same element is denoted with the same reference sign, and description is omitted.

A writing/reading circuit 20 writes inverted data of program data to a memory cell 10 at the time of programming, and reads program data from a memory cell 10 at the time of reading.

The inverted data generation circuit 40 generates inverted data of read program data. The read program data is also referred to as recall data.

After the reading, the writing/reading circuit 20 writes the inverted data of the read program data, which has been generated in the inverted data generation circuit 40, to the memory cell 10 from which the program data has been read.

When performing reading after writing the inverted data of the read program data, the writing/reading circuit 20 may just output inverted data of the read data. Alternatively, if supply of first and second power source voltages VDD1 and VDD2 is stopped once and is started again, the inverted data of the read program data is erased, and the memory cell 10 becomes in a state where the program data has been programmed. Therefore, the writing/reading circuit 20 can read the program data.

As described above, according to the present embodiment, after the reading, the inverted data of the read program data is written to the memory cell 10 from which the program data has been read. Therefore, in a load transistor in which a threshold is shifted by NBTI, the threshold is further shifted, and a threshold is not shifted in a load transistor at an opposite side. That is, there is no decrease with time of the shift amount of the threshold, and data retention is improved. Therefore, a possibility of a failure with time can be decreased.

Note that majority determination may be performed by combining of the third embodiment with the first or the second embodiment.

Fourth Embodiment

Prior to description of a fourth embodiment, overwriting of a memory cell 10 programmed using NBTI, which is known by the inventor, will be described.

While the semiconductor memory of the first embodiment is OTP that can be basically programmed only one time, if the semiconductor memory can be overwritten with program data, a multi time programmable (MTP) ROM that can be programmed a plurality of times can be realized.

However, the program data is programmed by shifting of a threshold of one load transistor in a memory cell 10. Thus, to perform overwriting with different program data, it is necessary to shift a threshold of the other load transistor until exceeding the threshold of the one load transistor. Therefore, when the threshold of the other load transistor does not exceed the threshold of the one load transistor, the overwriting is failed.

Figure 7:
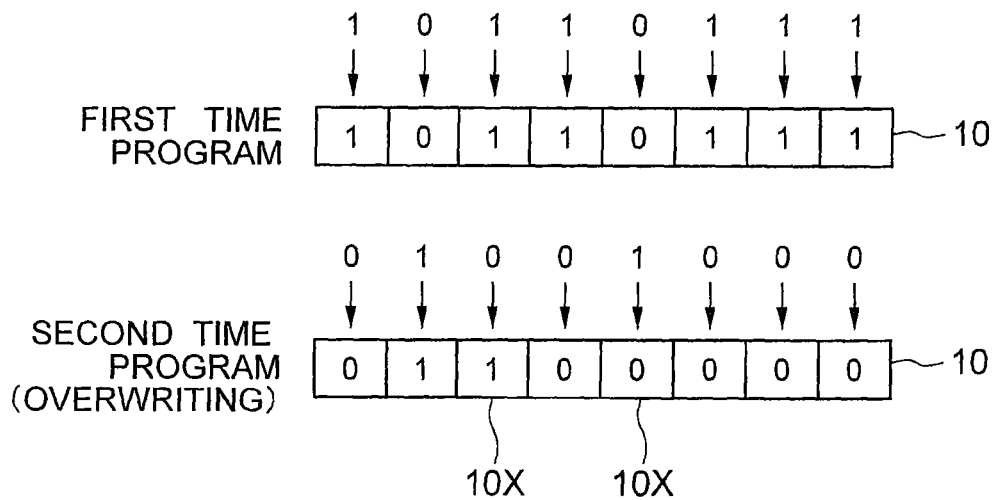
FIG. 7 is a diagram illustrating a result of overwriting of the semiconductor memory of the first embodiment with program data.

FIG. 7 is a diagram illustrating a result of overwriting of the semiconductor memory of the first embodiment with program data. In the programming of a first time, the program data can be correctly programmed in the memory cell 10. In the programming of a second time (overwriting) afterward, reverse program data to the programmed program data is programmed. However, the programming to two memory cells 10X and 10X has been failed because of the above reason.

To handle the above failure, in the fourth embodiment, a shift amount of a threshold by NBTI is made smaller, and the programming is performed in a weak manner. The configuration of the semiconductor memory is the same as that of the first embodiment of FIG. 1. Thus, the same element is denoted with the same reference sign, and illustration and description are omitted.

As described in the first embodiment, a threshold of a load transistor of either a first or second inverter INV1 or INV2 is shifted by being applied a stress according to inverted data of written program data.

In the present embodiment, a stress is applied such that the shift amount of the threshold of the load transistor becomes smaller than a maximum shift amount of the threshold of the load transistor. As the stress, a first power source voltage VDD1 is applied to the memory cell 10 for a fixed period. To make the shift amount of the threshold small, the first power source voltage VDD1 may be made smaller than that in the first embodiment, and the fixed period may be shorter than that in the first embodiment.

Accordingly, when overwriting is performed with different program data, a threshold of the other load transistor can be made larger than the threshold of the one load transistor, the threshold of which has been first shifted. Therefore, the program data can be programmed to the same memory cell 10 a plurality of times.

Here, in the present embodiment, the shift amount of the threshold is smaller than that in the first embodiment, and thus the number of memory cells 10, programming to which is failed, may be increased.

Figure 8:
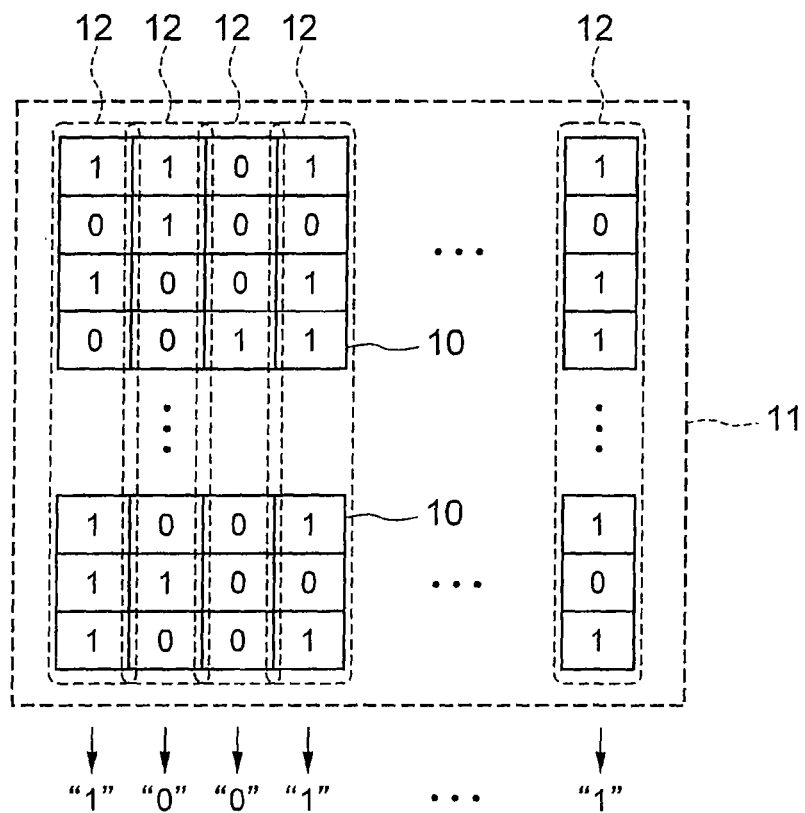
FIG. 8 is a diagram describing the program data programmed in a semiconductor memory according to a fourth embodiment.

FIG. 8 is a diagram describing the program data programmed in the semiconductor memory according to the fourth embodiment. While the same program data should be programmed in the memory cells 10 of the same unit memory cell group 12, there are several memory cells 10, programming to which has been failed, as illustrated in FIG. 8. However, if the number of simultaneously selected word lines (that is, the number of majority determination) is large, correct program data can be read.

Figure 9:
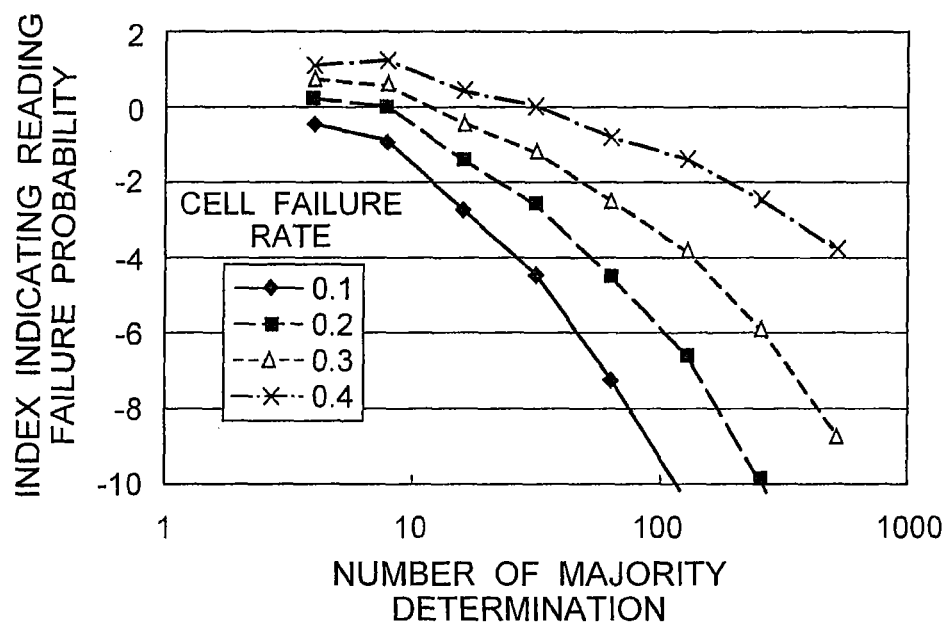
FIG. 9 is a diagram illustrating a relationship between a reading failure probability and the number of majority determination of the semiconductor memory according to the fourth embodiment.

FIG. 9 is a diagram illustrating a relationship between a reading failure probability and the number of majority determination of the semiconductor memory according to the fourth embodiment. The vertical axis of FIG. 9 is an index indicating the reading failure probability, and the reading failure probability is lower as the value is smaller. For example, −1 indicates that the reading failure probability is about 30%, and −3 indicates the reading failure probability is about 0.3%. The horizontal axis is the number of majority determination (the number of selected word lines).

In FIG. 9, variation of cell current ($1\sigma=10\%$) is taken into account. Further, FIG. 9 illustrates cases where cell failure rates are 0.1, 0.2, 0.3, and 0.4. The cell failure rate indicates a ratio of cells, programming to which has been failed. As illustrated in FIG. 9, by increasing of the number of majority determination, the reading failure probability can be sufficiently decreased.

As described above, according to the present embodiment, a stress is applied such that the shift amount of the threshold of the load transistor becomes smaller than the maximum shift amount of the load transistor. Therefore, the program data can be programmed in the same memory cell 10 a plurality of times. That is, the semiconductor memory can be used as MTP.

Note that the fourth embodiment may be combined with the second embodiment.

Fifth Embodiment

A fifth embodiment also enables easy overwriting. However, the fifth embodiment is different from the fourth embodiment, and overwriting is not performed when read program data is equal to program data to overwrite.

Figure 10:
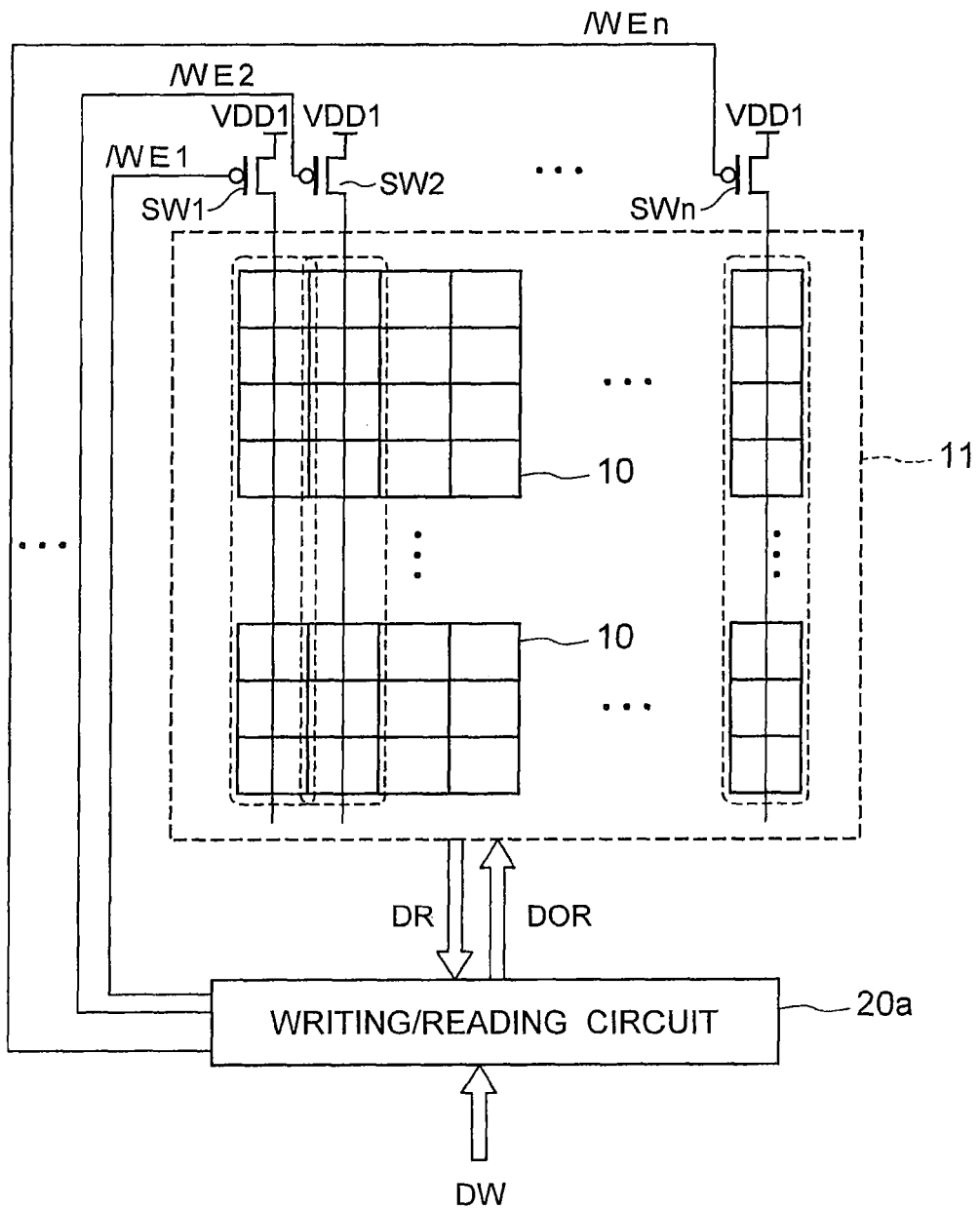
FIG. 10 is a block diagram illustrating a schematic configuration of a semiconductor memory according to a fifth embodiment.

FIG. 10 is a block diagram illustrating a schematic configuration of a semiconductor memory according to the fifth embodiment. As illustrated in FIG. 10, the semiconductor memory includes a plurality of switch elements SW1 to SWn, in addition to the configuration of FIG. 1. Further, a function of a writing/reading circuit 20a is different from that of FIG. 1. Other configurations are the same as those of FIG. 1. Thus the same element is denoted with the same reference sign, and description is omitted. Note that, while illustration of a row decoder is omitted, the row decoder has the same function as the row decoder 30a of FIG. 6.

Each of the switch elements SW1 to SWn short-circuits between a power source and a corresponding memory cell 10 at the time of ON, and releases between the power source and the corresponding memory cell 10 at the time of OFF. Each of the switch elements SW1 to SWn is provided at every plurality of memory cells 10 connected to the same pair of bit lines. Each of the switch elements SW1 to SWn is made of a PMOS transistor. That is, the PMOS transistor as each of the switch elements SW1 to SWn includes a source to which a first power source voltage VDD1 is supplied and a drain commonly connected to sources of load transistors L1 and L2 of each memory cell 10 through a power line.

Each of the switch elements SW1 to SWn may be provided at each memory cell 10.

The writing/reading circuit 20a writes inverted data of program data to the memory cell 10 at the time of first programming, and reads the program data from the memory cell 10 at the time of reading.

When program data DR read from the memory cell 10 to be overwritten is equal to program data DW to overwrite at the time of overwriting, the writing/reading circuit 20a switches a switch element corresponding to the memory cell 10 to be overwritten to OFF. Accordingly, shift of a threshold by NBTI does not occur.

When the program data DR read from the memory cell 10 to be overwritten is different from the program data DW to overwrite, the writing/reading circuit 20a switches the switch element corresponding to the memory cell 10 to be overwritten to ON, and writes inverted data DOR of the program data DW to overwrite to the memory cell 10 to be overwritten. Following that, a stress is applied to the memory cell 10 to be overwritten, so that the memory cell 10 is overwritten (programmed) with the program data DW to overwrite.

The writing/reading circuit 20a inverts a write enable signal WE that is an exclusive OR of the program data DR read from the memory cell 10 to be overwritten and the program data DW to overwrite, and supplies obtained inverted signal/WE to the gate of the PMOS transistor that is a switch element corresponding to the memory cell 10 to be overwritten.

As described above, according to the present embodiment, when the program data DR read from the memory cell 10 to be overwritten is equal to the program data DW to overwrite, the switch element is switched to OFF. Accordingly, a wasted increase in the threshold of the load transistor in the memory cell 10 to be overwritten can be prevented, and thus the overwriting can be more easily performed in the overwriting of the next time.

In contrast, in a semiconductor memory that programs data using existing NBTI, when the memory cell 10 to be overwritten, to which the program data "1" has been programmed, is overwritten (programmed) with program data "1" to overwrite, inverted data "0" is written and a stress is applied. Then, in one load transistor, the threshold that has already been increased is further increased. This is a wasted increase of the threshold, and thus a possibility of failing the overwriting of the next time becomes higher regarding the memory cell 10.

Further, as described in the second embodiment, when the program data is continuously held in the memory cell 10, the threshold of the load transistor at an opposite side to the load transistor, the threshold of which has been shifted by programming, is shifted by NBTI.

However, in the present embodiment, supply of the first power source voltage VDD1 is stopped in a predetermined case, and thus the threshold of the load transistor at an opposite side is not shifted at this time. Therefore, a failure with time in which the program data is inverted can be prevented.

Note that majority determination may be performed by combining of the fifth embodiment with the first or the second embodiment. In this case, each of the plurality of switch elements SW1 to SWn is provided at each unit memory cell group 12 that is an object to be written the same data.

Further, when weak writing is performed by combining of the fifth embodiment with the fourth embodiment, the overwriting can be more easily performed.

Sixth Embodiment

Prior to description of a sixth embodiment, MTP using OTP, which is known by the inventor, will be described.

Figure 11:
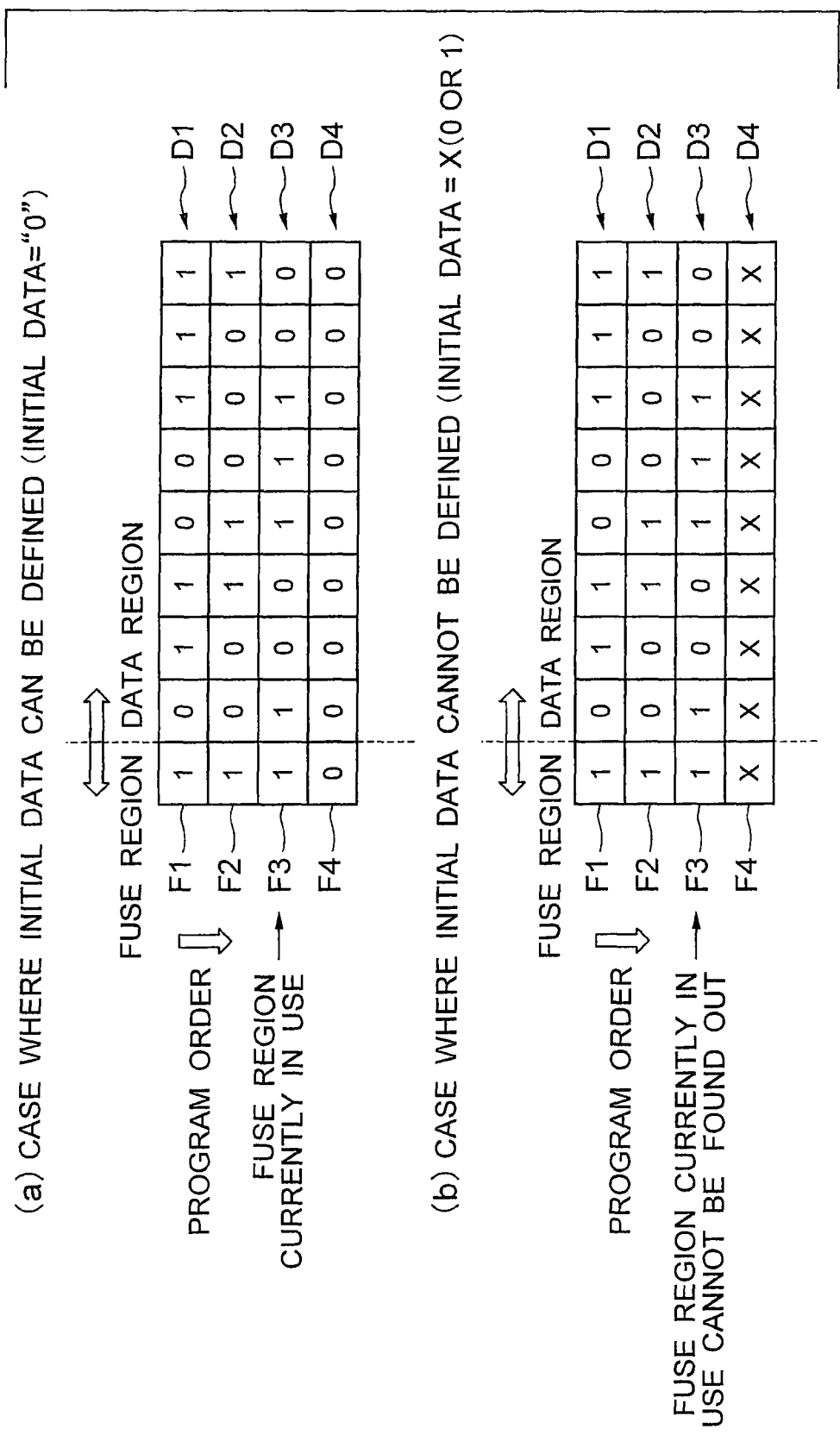
FIG. 11(a) is a diagram describing an operation of MTP using OTP, which can define initial data.
FIG. 11(b) is a diagram describing an operation of MTP using OTP, which cannot define initial data.

FIG. 11(a) is a diagram describing an operation of MTP using OTP, which can define initial data, and FIG. 11(b) is a diagram describing an operation of MTP using OTP, which cannot define initial data.

As illustrated in FIG. 11(a), in this MTP, a plurality of memory cells is divided into fuse regions F1 to F4 and data regions D1 to D4. Each of the plurality of fuse regions F1 to F4 is made of one memory cell, and the plurality of fuse regions is arranged in a bit line direction. Each of the plurality of data regions D1 to D4 is made of a plurality of memory cells connected to the same word line, and the plurality of data regions is arranged in a bit line direction. Corresponding fuse region and data regions are connected to the same word line. Each of the memory cells is OTP that can define initial data before programming is performed, and is made of an eFuse, for example.

When fuse data "1" has been programmed, each of the fuse regions F1 to F4 indicates program data has been programmed to corresponding data regions, and when the fuse data "1" is not programmed, that is, when it is the initial data (="0"), each of the fuse regions F1 to F4 indicates the program data is not programmed to the corresponding data regions.

The programming is performed according to a predetermined program order. The program order is an order of the fuse region F1, F2, F3, and F4, for example.

At the time of first programming, first, the fuse data "1" is programmed to the fuse region F1, and desired program data is programmed to the data region D1 corresponding to the fuse region F1, according to the program order.

At the time of overwriting, the fuse data "1" is programmed to the fuse region F2, and desired program data is programmed to the data region D2 corresponding to the fuse region F2, according to the program order. In the example of FIG. 11(a), overwriting is performed once again, and the fuse data "1" is programmed to the fuse region F3, and the desired program data is programmed to the data region D3 corresponding to the fuse region F3. The fuse region F4 and the data region D4 are the initial data. That is, each of the memory cells is programmed only one time.

At the time of reading, the data is read from the fuse regions F1 to F4 in the program order, and the fuse region F3 that is in the last order of the fuse regions F1, F2, and F3 from which the fuse data "1" has been read is identified as a fuse region in use. Then, the data is read from the data region D3 in use corresponding to the fuse region F3 in use.

In this way, MTP can be configured from OTP that can define the initial data.

In contrast, as illustrated in FIG. 11(b), when OTP that cannot define the initial data, that is, OTP in which the initial data is undefined (=X("0" or "1")) is used as each of the memory cells, there is a possibility that data of the fuse region F4 in the next order of the fuse region F3 in use is "1". Therefore, the fuse region in use cannot be identified by the same method as FIG. 11(a), and thus the data region in use cannot be identified.

A semiconductor memory that programs data using NBTI is OTP that cannot define the initial data, and thus cannot configure MTP that identifies the data region in use with the data of the fuse region.

Therefore, in the sixth embodiment, the MTP is configured without using a fuse region.

Figure 12:
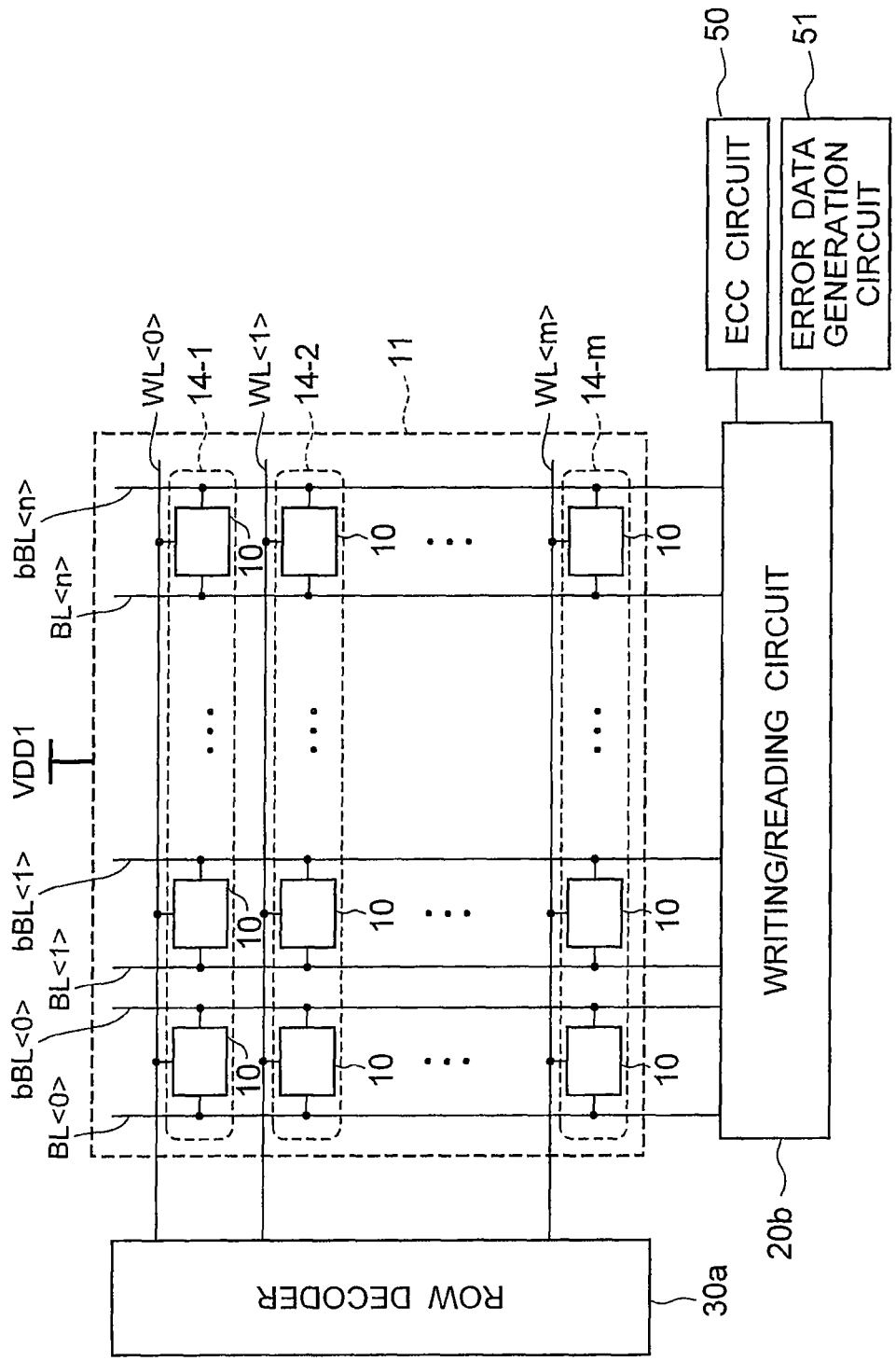
FIG. 12 is a block diagram illustrating a schematic configuration of a semiconductor memory according to a sixth embodiment.

FIG. 12 is a block diagram illustrating a schematic configuration of a semiconductor memory according to the sixth embodiment. As illustrated in FIG. 12, the semiconductor memory includes an error check circuit (ECC circuit) 50 and an error data generation circuit 51, in addition to the configuration of FIG. 1. Further, functions of a writing/reading circuit 20b and a row decoder 30a are different from those of FIG. 1. The row decoder 30a has the same function as the row decoder 30a of FIG. 6. Other configurations are the same as those of FIG. 1. Thus the same element is denoted with the same reference sign, and description is omitted.

The writing/reading circuit 20b reads data for each of memory cell groups 14-1 to 14-m at the time of reading according to a predetermined program order. Each of the memory cell groups 14-1 to 14-m is made of a plurality of memory cells 10 connected to one word line. The program order is, for example, an order of the memory cell groups 14-1, 14-2, . . . , 14-m.

The ECC circuit 50 checks an error of the data read for each of the memory cell groups 14-1 to 14-m. A method of checking the error may be any method, and a known error check method may be employed.

The error data generation circuit 51 generates error data that is determined as an error by the ECC circuit 50.

The writing/reading circuit 20b identifies a memory cell group, from which data that is not determined as an error by the ECC circuit 50 is first read, as a memory cell group in use, and outputs the first read data that is not determined as an error, as read data.

The writing/reading circuit 20b writes, at the time of first programming, inverted data of program data to the memory cell group 14-1 in the first order according to the program order.

At the time of overwriting, the writing/reading circuit 20b writes inverted data of the error data to the memory cell group in use, and writes inverted data of program data to overwrite to a memory cell group in the next order of the memory cell group in use according to the program order. Following that, a stress is applied, so that the memory cell group in use is overwritten (programmed) with the error data, and the memory cell group in the next order of the memory cell group in use is overwritten (programmed) with the program data.

Figure 13:
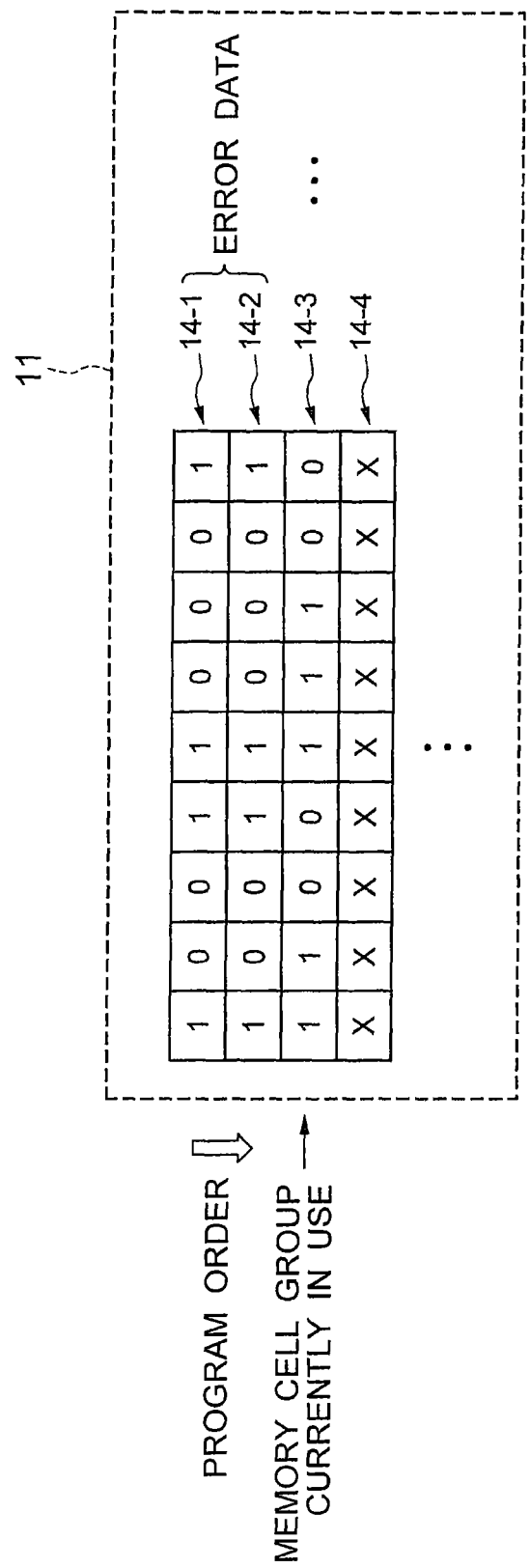
FIG. 13 is a diagram describing an operation of the semiconductor memory according to the sixth embodiment.

FIG. 13 is a diagram describing an operation of the semiconductor memory according to the sixth embodiment. As illustrated in FIG. 13, in this example, the error data is programmed to the memory cell groups 14-1 and 14-2, and the program data is programmed to the memory cell group 14-3. No data is programmed to the memory cell group 14-4.

As described above, the data is read for each of the memory cell groups 14-1 to 14-4 according to the program order at the time of reading. The data read from each of the memory cell groups 14-1 and 14-2 is the error data, and thus is determined as an error by the ECC circuit 50. The data read from the memory cell group 14-3 is not determined as an error by the ECC circuit 50. Therefore, the memory cell group 14-3 is identified as the memory cell group in use, and the data read from the memory cell group 14-3 is output.

When overwriting is performed under this state, the inverted data of the error data is written to the memory cell group 14-3 in use, and the inverted data of the program data to overwrite is written to the memory cell group 14-4 in the next order of the memory cell group 14-3 in use.

As described above, according to the present embodiment, the inverted data of the error data is written to the memory cell group in use at the time of overwriting, so that the error data is programmed. Therefore, the memory cell group in use can be identified using the error data, without using a fuse region. Therefore, the MTP can be configured.

Note that, the sixth embodiment may be combined with the first or the second embodiment, and bits of each of the memory cell groups 14-1 to 14-m may be configured from a plurality of memory cells 10 connected to a set of a pair of bit lines and majority determination may be performed for each bit. Accordingly, the failure probability can be decreased.

Further, the sixth embodiment may be combined with the fourth and/or the fifth embodiment(s), and the overwriting of the error data may be able to be easily performed.

Seventh Embodiment

In a seventh embodiment, MTP is configured using fuse regions having a plurality of bits, which is different from the sixth embodiment.

Figure 14:
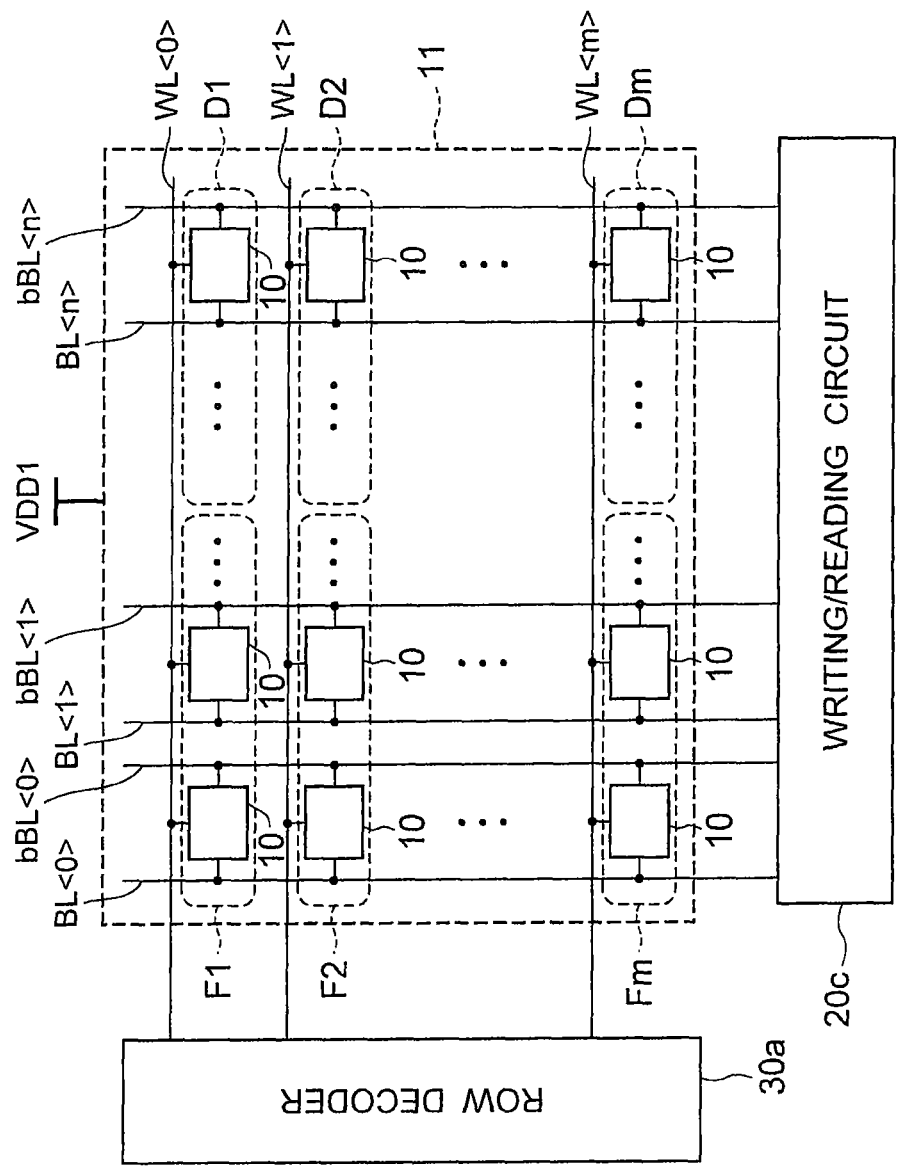
FIG. 14 is a block diagram illustrating a schematic configuration of a semiconductor memory according to a seventh embodiment.

FIG. 14 is a block diagram illustrating a schematic configuration of a semiconductor memory according to the seventh embodiment. As illustrated in FIG. 14, in the semiconductor memory, functions of a writing/reading circuit 20c and a row decoder 30a are different from those in FIG. 1. The row decoder 30a has the same function as the row decoder 30a of FIG. 6. Other configurations are the same as those of FIG. 1. Thus the same element is denoted with the same reference sign, and description is omitted.

Each of a plurality of fuse regions F1 to Fm is made of a plurality of memory cells 10 connected to the same word line. The plurality of fuse regions F1 to Fm is arranged in a bit line direction. Each of a plurality of data regions D1 to Dm is made of a plurality of memory cells 10 connected to the same word line. The plurality of data regions D1 to Dm is arranged in a bit line direction. Corresponding fuse regions and data regions are connected to the same word line.

The writing/reading circuit 20c reads, at the time of reading, data from the plurality of fuse regions F1 to Fm in a predetermined program order, identifies a fuse region in the last order of the fuse regions from which predetermined fuse data has been read, as a fuse region in use, and reads data from a data region in use corresponding to the fuse region in use, of the plurality of data regions D1 to Dm.

The program order is an order of the fuse regions F1, F2, . . . , Fm, for example.

The writing/reading circuit 20c writes, at the time of first programming, inverted data of the fuse data to the fuse region F1 in the first order, and writes inverted data of program data to overwrite to the data region D1 corresponding to the fuse region F1 in the first order, according to the program order.

The writing/reading circuit 20c writes, at the time of overwriting, the inverted data of the fuse data in a fuse region in the next order of the fuse region in use, and writes the inverted data of the program data to overwrite to a data region corresponding to the fuse region in the next order, according to the program order. Following that, a stress is applied, so that the fuse data is programmed to the fuse region in the next order of the fuse region in use, and the data region corresponding to the fuse region in the next order is overwritten (programmed) with the program data.

Figure 15:
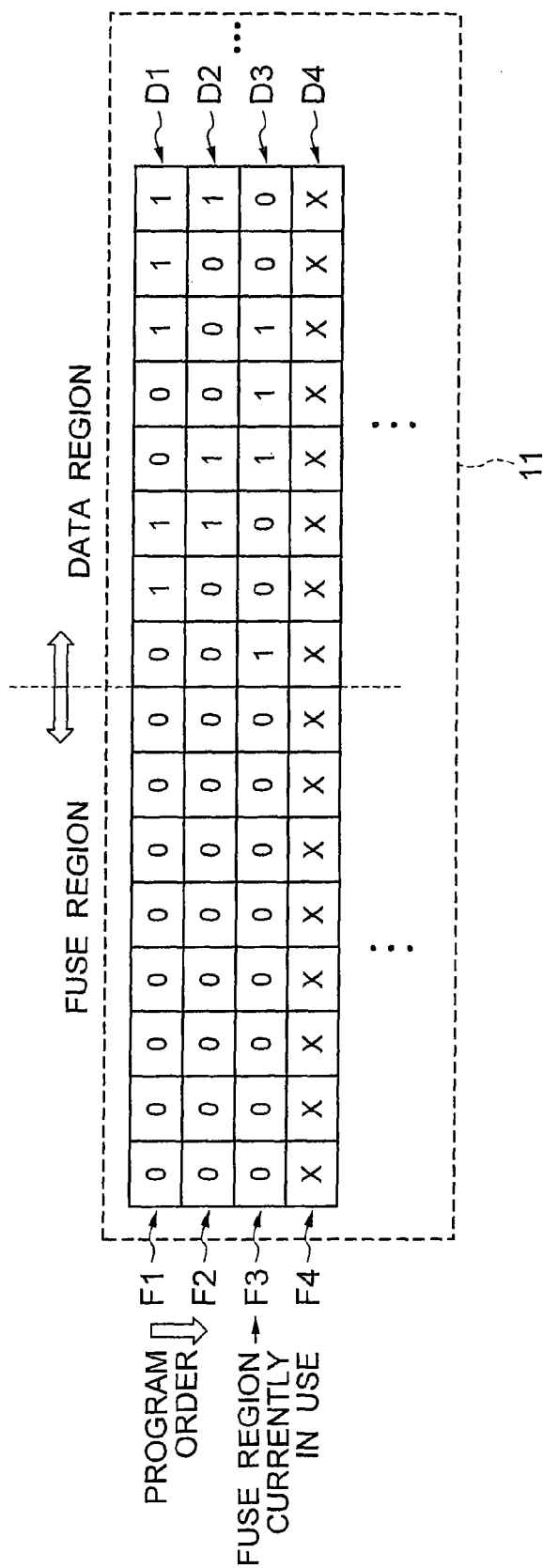
FIG. 15 is a diagram describing an operation of the semiconductor memory according to the seventh embodiment.

FIG. 15 is a diagram describing an operation of the semiconductor memory according to the seventh embodiment. As illustrated in FIG. 15, in this example, fuse data (="00000000") is programmed to the fuse regions F1, F2, and F3, and program data is programmed to the data regions D1, D2, and D3. The fuse region F4 and the data region D4 are not programmed, and data thereof is undefined (X).

As described above, the writing/reading circuit 20c reads the data from the fuse regions F1 to F4 in the predetermined program order at the time of reading. The data of the fuse region F4 is undefined, and thus is random data. A probability of the data of the fuse region F4 being equal to the fuse data becomes lower as the bit number is larger.

The writing/reading circuit 20c identifies the fuse region in the last order of the fuse regions F1 to F3, from which the fuse data has been read, as the fuse region F3 in use. The writing/reading circuit 20c then reads the data from the data region D3 in use corresponding to the fuse region F3 in use, of the data regions D1 to D4.

When overwriting is performed under this state, the writing/reading circuit 20c writes inverted data of the fuse data to the fuse region F4 in the next order of the fuse region F3 in use, and writes inverted data of the program data to overwrite to the data region D4 corresponding to the fuse region F4 in the next order, according to the program order.

The fuse data may just be distinct from the random data. Therefore, the fuse data may include not only the same logical value in all bits, like the example of FIG. 15, but also different logical values.

As described above, according to the present embodiment, the fuse data is programmed to the fuse region, where the plurality of memory cells 10 is treated as one fuse region. Accordingly, the initial data of the fuse region can be defined to random data. Therefore, the data region in use can be expressed in a signal state of the fuse region, and thus the MTP can be configured.

Note that the seventh embodiment may be combined with the first or the second embodiment, bits of each of the fuse regions may be configured from a plurality of memory cells 10 connected to a set of a pair of bit lines, bits of each of the data regions may be configured from a plurality of memory cells 10 connected to a set of a pair of bit lines, and majority determination may be performed for each bit. Accordingly, the failure probability can be decreased.

Further, the seventh embodiment may be combined with the third embodiment.

Eighth Embodiment

In an eighth embodiment, initial data of a fuse region is defined and MTP is configured, which is different from the sixth and seventh embodiments.

Figure 16:
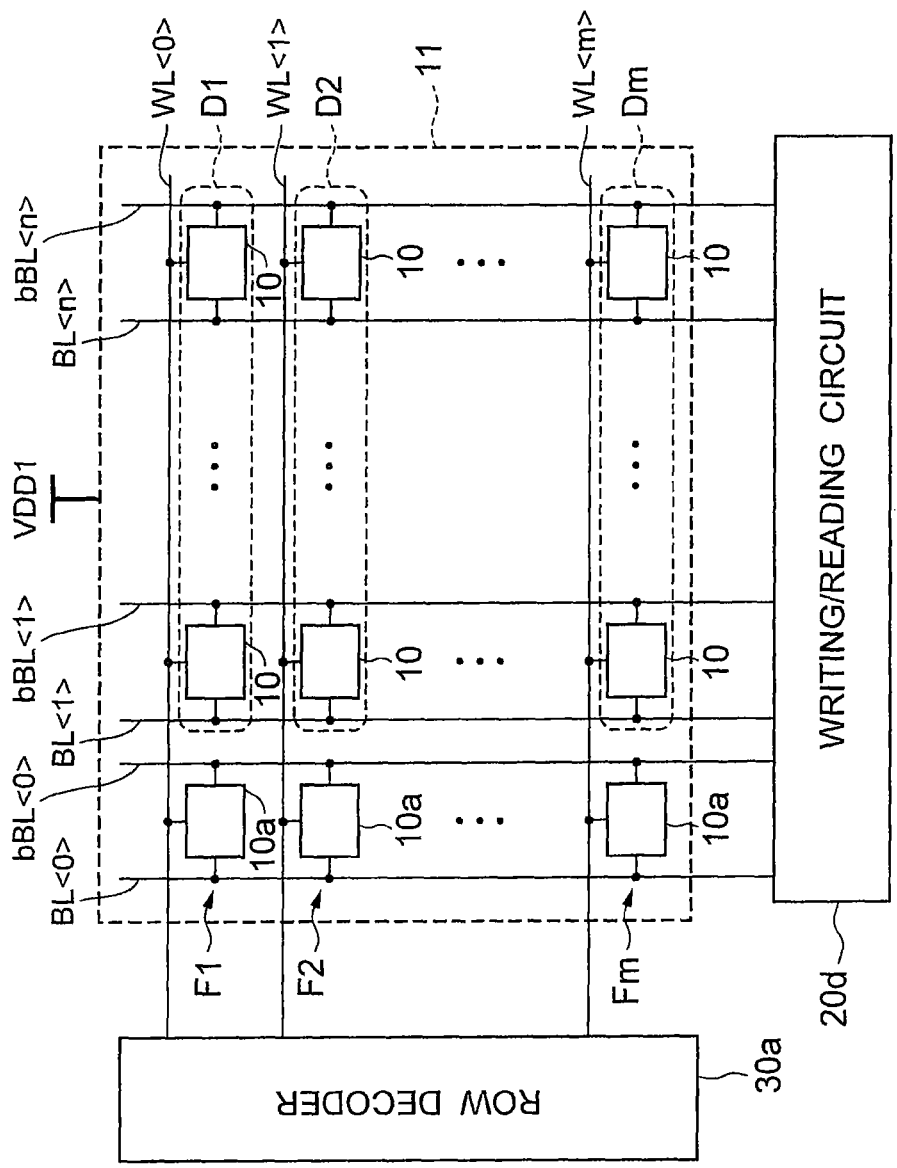
FIG. 16 is a block diagram illustrating a schematic configuration of a semiconductor memory according to an eighth embodiment.

FIG. 16 is a block diagram illustrating a schematic configuration of a semiconductor memory according to the eighth embodiment. As illustrated in FIG. 16, the semiconductor memory is different from that of FIG. 14 in configurations of memory cells 10a for fuse regions F1 to Fm, and a function of a writing/reading circuit 20d. Other configurations are the same as those in FIG. 14. Therefore, the same element is denoted with the same reference sign, and description is omitted.

Each of the plurality of fuse regions F1 to Fm is made of the memory cell 10a. The plurality of fuse regions F1 to Fm is arranged in a bit line direction. Each of a plurality of data regions D1 to Dm is made of a plurality of memory cells 10 connected to the same word line. The plurality of data regions D1 to Dm is arranged in the bit line direction. Corresponding fuse region and data regions are connected to the same word line.

The writing/reading circuit 20d reads, at the time of reading, data from the plurality of fuse regions F1 to Fm in a predetermined program order, identifies a fuse region in the last order of the fuse regions, from which predetermined fuse data has been read, as a fuse region in use, and reads data from a data region in use corresponding to the fuse region in use, of the plurality of data regions D1 to Dm.

The program order is, for example, an order of the fuse regions F1, F2, Fm.

The writing/reading circuit 20d writes, at the time of first programming, inverted data of the fuse data to the fuse region F1 in the first order, and writes inverted data of program data to overwrite to the data region D1 corresponding to the fuse region F1 in the first order, according to the program order.

The writing/reading circuit 20d writes, at the time of overwriting, the inverted data of the fuse data to a fuse region in the next order of the fuse region in use in order to program the fuse data, and writes the inverted data of the program data to overwrite to a data region corresponding to the fuse region in the next order in order to program the program data to overwrite, according to the program order.

Figure 17:
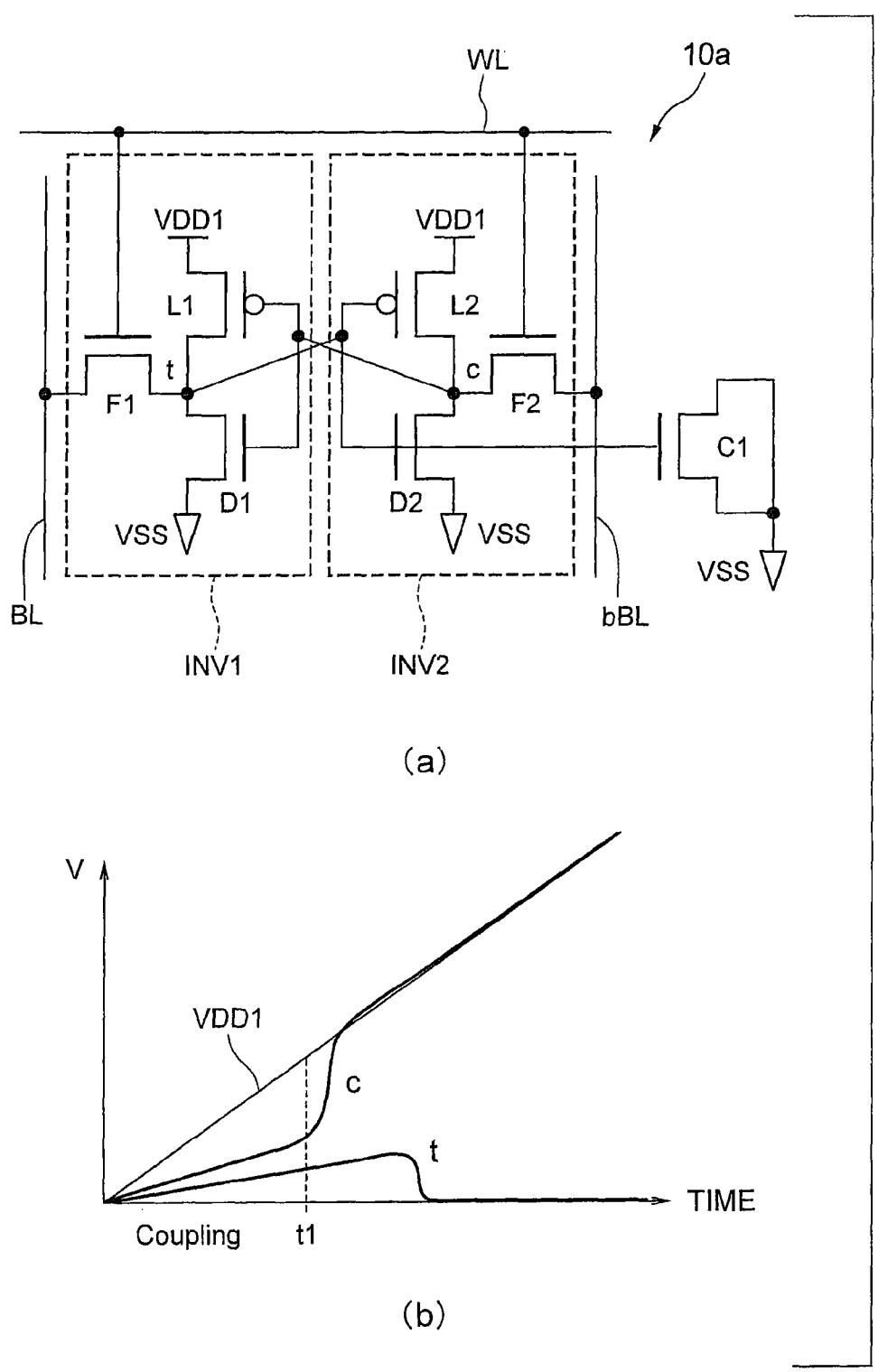
FIG. 17(a) is a circuit diagram of the memory cell of each of the fuse regions according to the eighth embodiment.
FIG. 17(b) is a characteristic diagram of the memory cell of FIG. 17(a) at the time of power up.

FIG. 17(a) is a circuit diagram of the memory cell 10a of each of the fuse regions F1 to Fm according to the eighth embodiment, and FIG. 17(b) is a characteristic diagram of the memory cell 10a of FIG. 17(a) at the time of power up. As illustrated in FIG. 17(a), the memory cell 10a includes a memory cell 10 of FIG. 2 and a capacitive element C1 provided to the memory cell 10. Other configurations are the same as those of the memory cell 10 of FIG. 2. Thus, the same element is denoted with the same reference sign, and description is omitted.

First and second inverters INV1 and INV2 of the memory cell 10a are configured in an imbalance manner so that inverted data of fuse data is read when the fuse data has not been programmed. Accordingly, initial data can be defined to the inverted data of the fuse data.

Similarly to FIG. 2, a load transistor L1 includes a source to which a first power source voltage VDD1 is supplied. A drive transistor D1 includes a gate connected to a gate of the load transistor L1, a drain connected to a drain of the load transistor L1, and a source to which a ground voltage VSS is supplied.

A load transistor L2 includes a source to which the first power source voltage VDD1 is supplied. A drive transistor D2 includes a gate connected to a gate of the load transistor L2, a drain connected to a drain of the load transistor L2, and a source to which the ground voltage VSS is supplied.

The capacitive element C1 is connected between the gates of the load transistor L2 and the drive transistor D2, and the ground voltage VSS. The capacitive element C1 is made of an NMOS transistor to which a source and a drain are connected.

As illustrated in FIG. 17(b), the first power source voltage VDD1 is increased over time at the time of power up of the memory cell 10a. At this time, a storage node t is coupled with the ground voltage VSS by the capacitive element C1, and thus a voltage of the storage node t is lower than a voltage of a storage node c. Therefore, when a time t1 is passed, the load transistor L2 is turned ON first, and the voltage of the storage node c reaches the first power source voltage VDD1. The drive transistor D1 is turned ON accordingly, and the voltage of the storage node t becomes the ground voltage VSS.

As described above, in this example, the initial data is "0".

When the initial data is set to "1", the capacitive element C1 may just be connected between the gates of the load transistor L1 and the drive transistor D1, and the ground voltage VSS.

Figure 18:
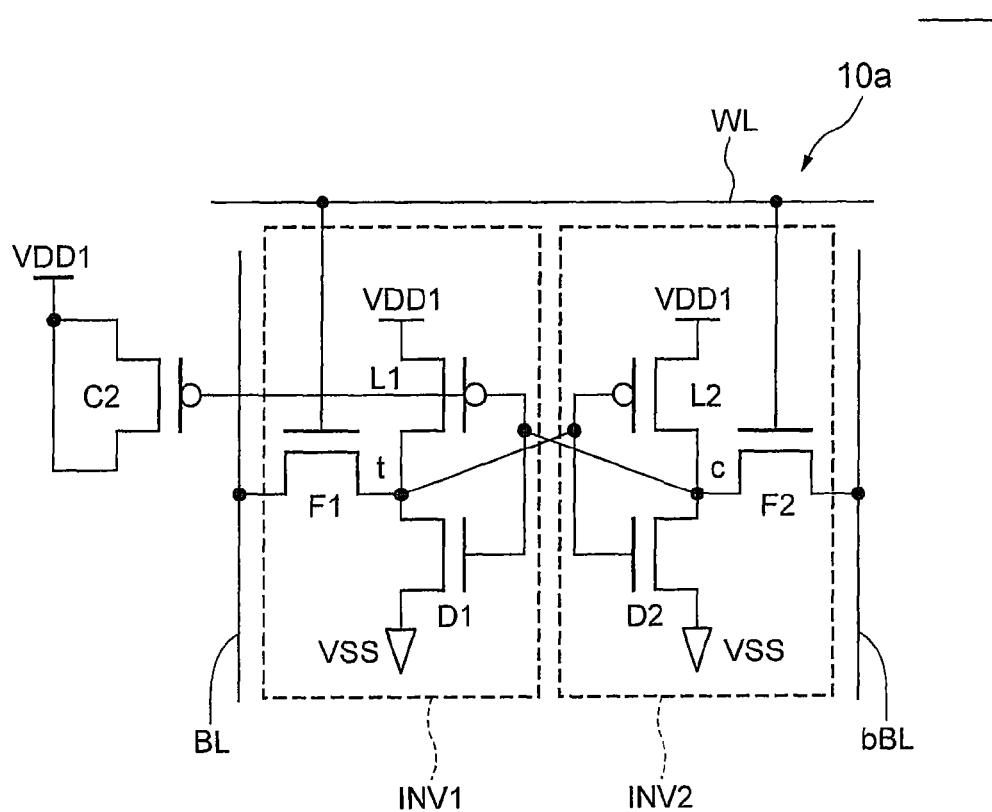
FIG. 18(a) is another circuit diagram of the memory cell of each of the fuse regions according to the eighth embodiment.
FIG. 18(b) is a characteristic diagram of the memory cell of FIG. 18(a) at the time of power up.
Figure 18:
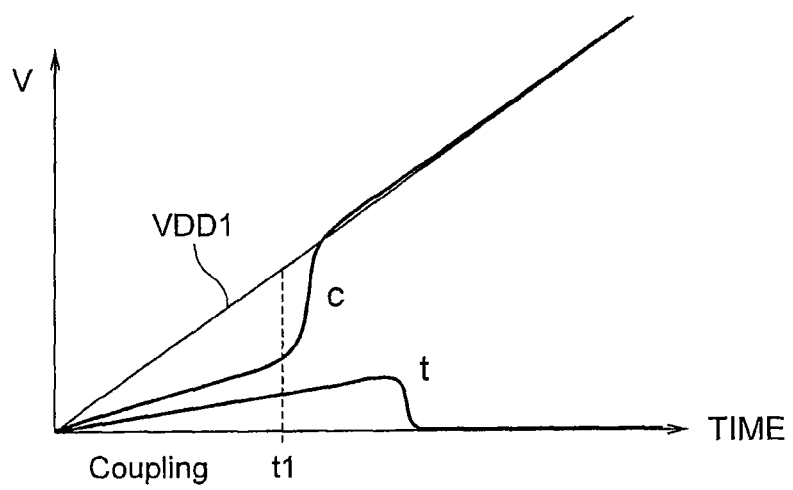

FIG. 18(a) is another circuit diagram of the memory cell 10a of each of the fuse regions F1 to Fm according to the eighth embodiment, and FIG. 18(b) is a characteristic diagram of the memory cell 10a of FIG. 18(a) at the time of power up. As illustrated in FIG. 18(a), the memory cell 10a includes a capacitive element C2, instead of the capacitive element C1 of the memory cell 10a of FIG. 17(a). A configuration thereof is the same as that of FIG. 17(a).

The capacitive element C2 is connected between the gates of the load transistor L1 and the drive transistor D1, and the first power source voltage VDD1. The capacitive element C2 is made of a PMOS transistor to which a source and a drain are connected.

As illustrated in FIG. 18(b), after the power up, a storage node c is coupled with the first power source voltage VDD1 by the capacitive element C2, and thus a voltage of the storage node c is higher than a voltage of a storage node t. Therefore, when a time t1 is passed, the load transistor L2 is turned ON first, and the voltage of the storage node c reaches the first power source voltage VDD1. The drive transistor D1 is turned ON accordingly, and the voltage of the storage node t becomes the ground voltage VSS.

As described above, in this example, the initial data is also "0".

When the initial data is set to "1", the capacitive element C2 may just be connected between the gates of the load transistor L2 and the drive transistor D2, and the first power source voltage VDD1.

As described above, since the initial data of the memory cell 10a of each of the fuse regions F1 to Fm is "0", the MTP can be realized by the above-described method with reference to FIG. 11(a) by the operation of the writing/reading circuit 20d.

When the fuse data "1" that indicates completion of programming is programmed to the memory cell 10a of each of the fuse regions F1 to Fm, a threshold of the load transistor L2 may just be shifted using NBTI.

As described above, according to the present embodiment, the first and second inverters INV1 and INV2 of the memory cell 10a of each of the fuse regions F1 to Fm are configured in an imbalance manner so that the inverted data of the fuse data is read when the fuse data has not been programmed. Therefore, the initial data of the fuse region can be defined to the inverted data of the fuse data. Therefore, the data region in use can be expressed in a signal state of the fuse region, and thus the MTP can be configured.

Note that the eighth embodiment may be combined with the first or the second embodiment, the fuse region may be configured from a plurality of memory cells 10a connected to a set of a pair of bit lines, bits of each of the data regions is configured from a plurality of memory cells 10 connected to a set of a pair of bit lines, and majority determination may be performed for each bit. Accordingly, the failure probability can be decreased.

Further, the eighth embodiment may be combined with the third embodiment.

Modification of Eighth Embodiment

The first and second inverters INV1 and INV2 may be configured in an imbalance manner as follows.

Figure 19:
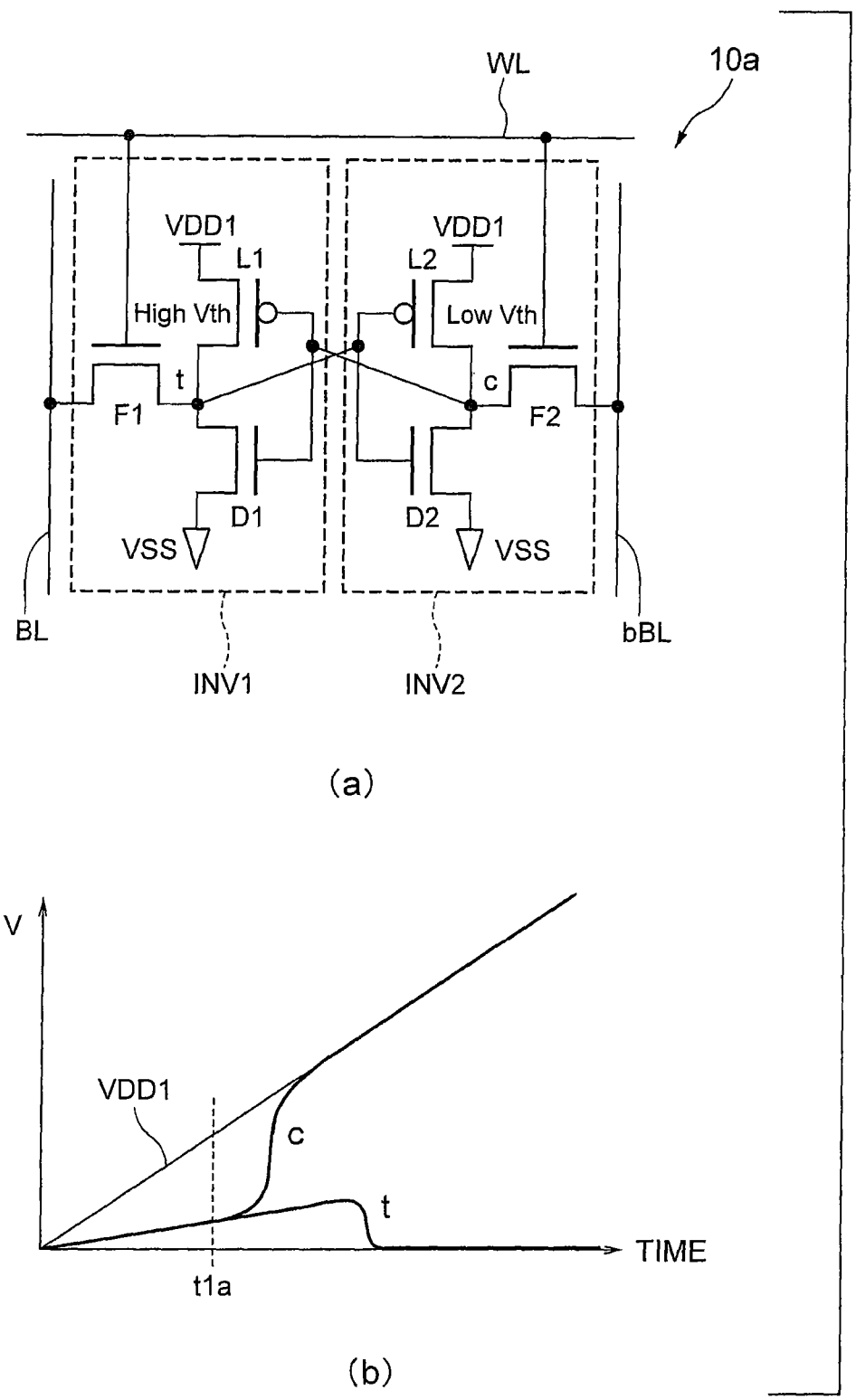
FIG. 19(a) is a circuit diagram of a memory cell of each of fuse regions according to a modification of the eighth embodiment.
FIG. 19(b) is a characteristic diagram of the memory cell of FIG. 19(a) at the time of power up.

FIG. 19(a) is a circuit diagram of a memory cell 10a of each of fuse regions F1 to Fm according to a modification of the eighth embodiment, and FIG. 19(b) is a characteristic diagram of the memory cell 10a of FIG. 19(a) at the time of power up.

As illustrated in FIG. 19(a), a threshold of a load transistor L1 is higher than a threshold of a load transistor L2 when fuse data has not been programmed. That is, the load transistor L1 and the load transistor L2 have different device structures, and the thresholds are different at the time of manufacturing a semiconductor memory.

From this, as illustrated in FIG. 19(b), when a first power source voltage VDD1 is increased from 0 V, voltages of storage nodes t and c are nearly equal until a time t1a. After the time t1a, the load transistor L2 is turned ON first, and the storage node c becomes "1" and the storage node t becomes "0". That is, initial data is "0".

Note that, when the initial data is set reverse to the example of FIGS. 19(a) and 19(b), the threshold of the load transistor L1 may just be made lower than the threshold of the load transistor L2.

Further, the load transistor L1 and the load transistor L2 may have the same device structure like an existing semiconductor memory, and the thresholds may be made different using NBTI in advance.

Further, by making of channel widths W and/or channel lengths L of the load transistors L1 and L2 different, the first and second inverters INV1 and INV2 may be configured in an imbalance manner. Alternatively, by making of channel widths W and/or channel lengths L of drive transistors D1 and D2 different, the first and second inverters INV1 and INV2 may be configured in an imbalance manner.

Further, the first and second inverters INV1 and INV2 may be configured in an imbalance manner by making of parasitic resistance (wiring resistance or the like) of current paths of the first and second inverters INV1 and INV2 different. That is, the parasitic resistance between a source of the load transistor L1 and a source of the drive transistor D1 and the parasitic resistance between a source of the load transistor L2 and a source of the drive transistor D2 may be made different.

With these modifications, similar effects to the eighth embodiment can be obtained.

Ninth Embodiment

The present embodiment is different from the eighth embodiment in that a PMOS transistor PM1 is provided between sources of load transistors L1 and L2 in memory cells 10a of fuse regions F1 to Fm and a first power source voltage VDD1.

Other configurations are the same as those in the eighth embodiment of FIG. 16. Thus, the same element is denoted with the same reference sign, and description is omitted.

Figure 20:
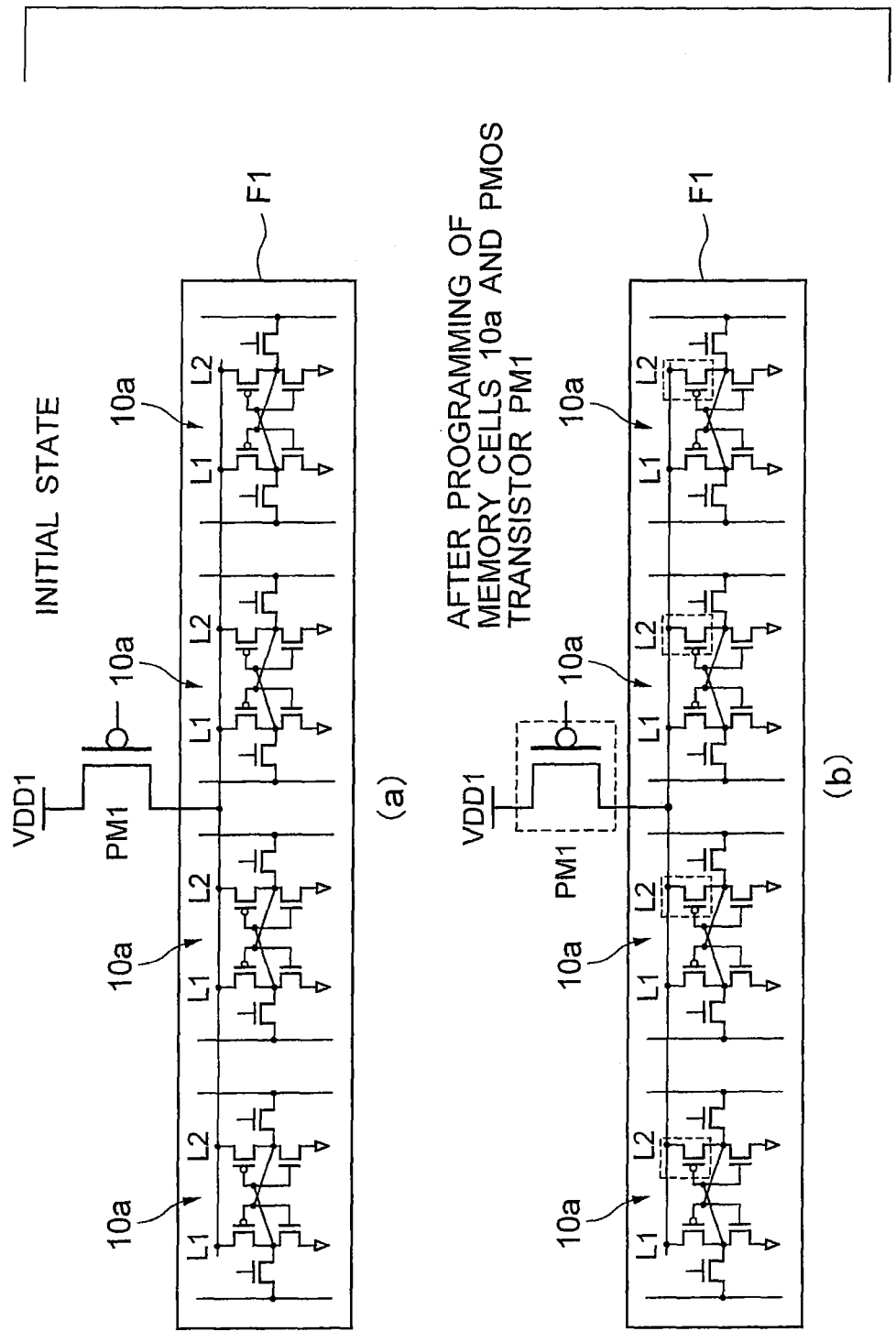
FIGS. 20(a) and 20(b) are diagrams illustrating a configuration of a fuse region of a semiconductor memory according to a ninth embodiment.

FIGS. 20(a) and 20(b) are diagrams illustrating a configuration of a fuse region F1 of a semiconductor memory according to the ninth embodiment. FIG. 20(a) is a diagram for describing an initial state, and FIG. 20(b) is a diagram for describing a state after programming.

The fuse region F1 is made of four memory cells 10a, as an example. These four memory cells 10a are connected to the same pair of bit lines, and majority determination can be performed, similarly to the first embodiment.

The sources of load transistors L1 and L2 of the four memory cells 10a are mutually connected. The semiconductor memory includes the PMOS transistor PM1 connected between the sources of the load transistors L1 and L2 of corresponding four memory cells 10a and the first power source voltage VDD1.

Note that, for clarifying the description, illustration of a capacitive element C1 is omitted in each of the memory cells 10a.

Other fuse regions F2 to Fm have similar configurations. That is, the semiconductor memory includes a plurality of PMOS transistors PM1. Each of the PMOS transistors PM1 is connected between the sources of the load transistors L1 and L2 of corresponding memory cells 10a and the first power source voltage VDD1.

Note that each of the fuse regions F1 to Fm may be made of one memory cell 10a, similarly to the eighth embodiment.

The writing/reading circuit 20d turns ON the PMOS transistor PM1 corresponding to a fuse region in the next order to which inverted data of the fuse data is written at the time of overwriting, and shifts a threshold of the PMOS transistor PM1 using NBTI accordingly, in addition to the function described in the eighth embodiment.

Accordingly, as illustrated in FIG. 20(b), after programming, thresholds of the PMOS transistor PM1 and the load transistor L2 surrounded by the broken lines are shifted.

Further, the writing/reading circuit 20d turns the plurality of PMOS transistors PM1 ON at the time of reading, and then reads the data from the plurality of fuse regions F1 to Fm in a program order.

Figure 21:
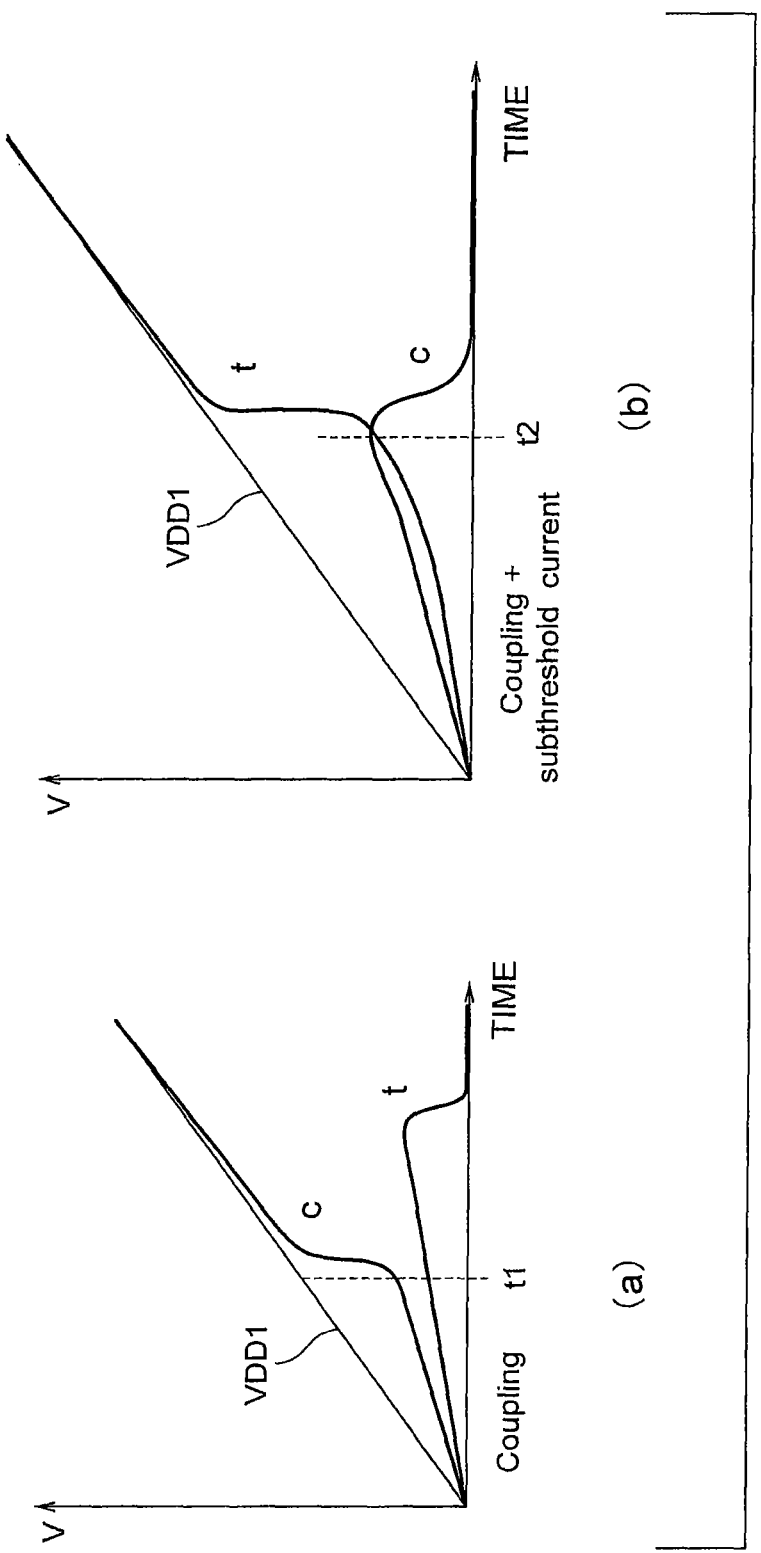
FIG. 21(a) is a characteristic diagram of the memory cell in an initial state of FIG. 20(a) at the time of power up.
FIG. 21(b) is a characteristic diagram of the memory cell after programming of FIG. 20(b) at the time of power up.

FIG. 21(a) is a characteristic diagram of the memory cell 10a in an initial state of FIG. 20(a) at the time of power up, and FIG. 21(b) is a characteristic diagram of the memory cell 10a after programming of FIG. 20(b) at the time of power up.

In the initial state, the threshold of the PMOS transistor PM1 is not shifted, and thus the PMOS transistor PM1 is turned ON at a high speed. Therefore, ramp-up of the first power source voltage VDD1 supplied to the sources of the load transistors L1 and L2 is fast. Therefore, as illustrated in FIG. 21(a), the initial data is determined to "0" according to the capacitive element C1. This is similar to the characteristics of FIG. 17(b), and the like.

After programming, the threshold of the PMOS transistor PM1 has been shifted, and thus the PMOS transistor PM1 is turned ON from the initial state at a low speed. Therefore, the ramp-up of the first power source voltage VDD1 to be supplied to the sources of the load transistors L1 and L2 is slower than the initial state. Therefore, as illustrated in FIG. 21(b), first, a storage node t is coupled with a ground voltage VSS by a capacitive element C1. However, a sub-threshold current is started to flow in the load transistor L1 over time, and a voltage of the storage node t is increased. Then, when a time t2 later than a time t1 is passed, the storage node t reaches the first power source voltage VDD1. As described above, the time during which the sub-threshold current flows in the load transistor L1 can be secured longer than the eighth embodiment, and thus the program data is more reliably determined to "1" according to the threshold.

Figure 22:
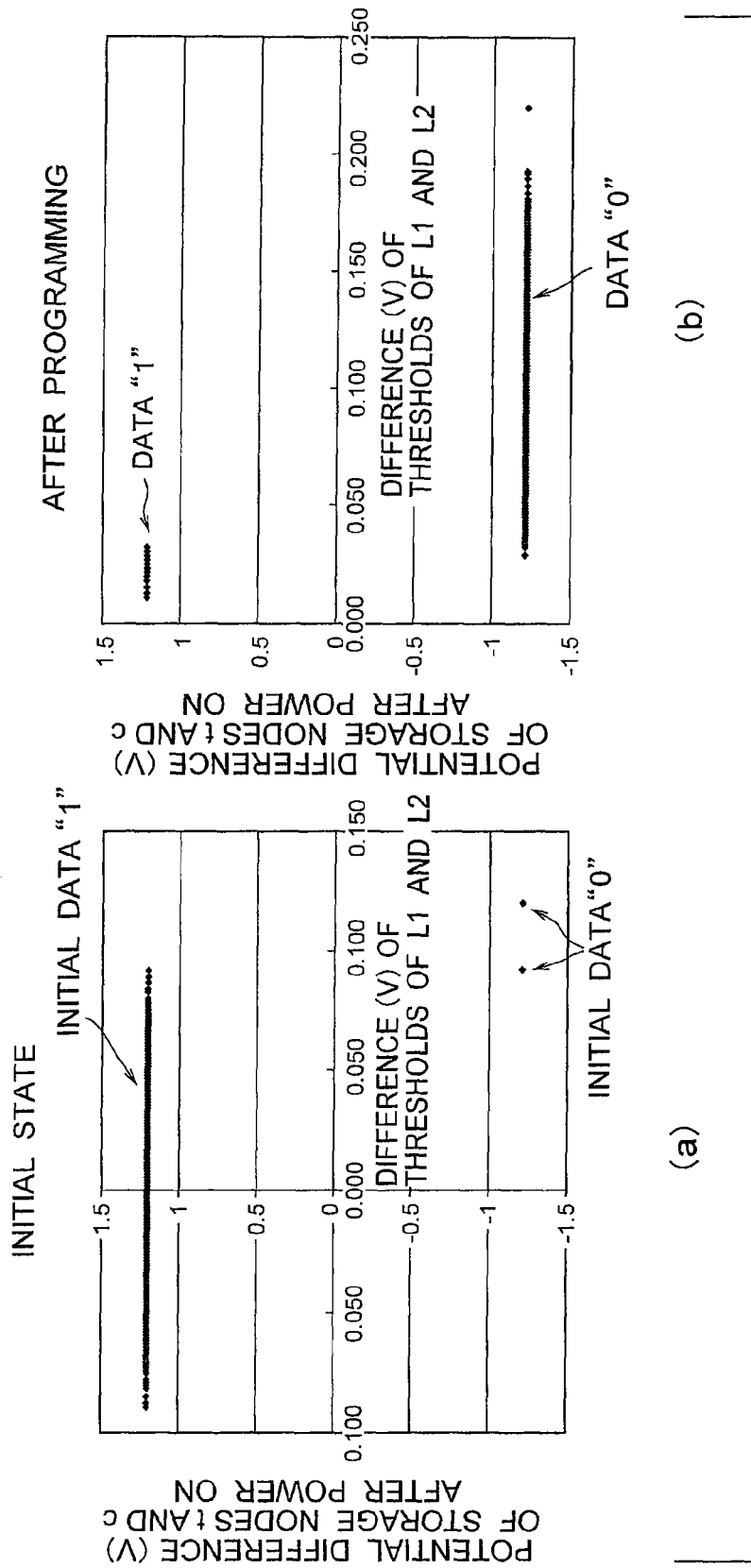
FIG. 22(a) illustrates a result of the Monte Carlo analysis of data read from the memory cell in the initial state.
FIG. 22(b) illustrates a result of the Monte Carlo analysis of data read from the memory cell after programming.

FIG. 22(a) illustrates a result of the Monte Carlo analysis of data read from the memory cell 10a in the initial state, and FIG. 22(b) illustrates a result of the Monte Carlo analysis of data read from the memory cell 10a after programming. In FIG. 22(a), the initial data is made "1" and in FIG. 22(b), the data after programming is made "0", and a ramp-up time of the first power source voltage VDD1 supplied to the sources of the load transistors L1 and L2 is ten times of that of FIG. 22(a).

The horizontal axis of FIGS. 22(a) and 22(b) indicates a difference between the threshold of the load transistor L2 and the threshold of the load transistor L1, and the vertical axis indicates a potential difference between the storage nodes t and c after power on.

As illustrated in FIG. 22(a), even if the difference between the thresholds of the load transistors L1 and L2 varies due to process variation, and the like, the correct initial data "1" can be read in most cases. When the difference between the thresholds is extremely large, wrong initial data "0" is read. However, this can be relieved by majority determination.

As illustrated in FIG. 22(b), even if the difference between the thresholds of the load transistors L1 and L2 varies, the programmed correct data "0" can be read in most cases. When the difference between the thresholds is small, the wrong data "1" is read. However, this can be relieved by majority determination.

As described above, according to the present embodiment, the PMOS transistor PM1 corresponding to the fuse region to which the inverted data of the fuse data is written is turned ON at the time of overwriting, and the threshold of the PMOS transistor PM1 is shifted, accordingly. Therefore, the ramp-up of the first power source voltage VDD1 supplied to the sources of the load transistors L1 and L2 can be made slow at the time of reading, and thus correct program data can be more reliably read than the eighth embodiment.

According to the embodiments described above, failure due to programming of data using NBTI can be handled.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory comprising:
   a plurality of word lines;
   a plurality of sets of a pair of bit lines intersecting with the plurality of word lines;
   a plurality of memory cells provided at intersection portions of the plurality of word lines and the plurality of sets of a pair of bit lines, the memory cells respectively having a first inverter and a second inverter that are cross-coupled;
   a unit memory cell group made of a plurality of memory cells connected to a set of a pair of bit lines;
   a writing/reading circuit configured to write inverted data of program data to the unit memory cell group, and to read data, which is based on a signal level of the pair of bit lines, from the unit memory cell group; and
   a word line selection circuit configured to simultaneously select two or more word lines of the plurality of word lines connected to the unit memory cell group to which program data has been written, at the time of reading, wherein
   a first power source voltage is applied to the first inverter and the second inverter for a fixed period in a state of holding the inverted data of the program data, and
   the first power source voltage is higher than a second power source voltage supplied to the writing/reading circuit and the word line selection circuit.

2. The semiconductor memory according to claim 1, wherein
   each of the first inverter and the second inverter comprises a load transistor comprising a source to which the first power source voltage is supplied, and a drive transistor comprising a gate connected to a gate of the load transistor, a drain connected to a drain of the load transistor, and a source to which a ground voltage is supplied, and the program data is programmed by making of thresholds of the two load transistors of the memory cell different by negative bias threshold instability (NBTI).

3. The semiconductor memory according to claim 1, wherein the word line selection circuit simultaneously selects and drives the word lines at a time of an initial test, the number of the word lines selected at the time of the initial test is smaller than the number of word lines selected at the time of reading.

4. The semiconductor memory according to claim 3, wherein the semiconductor memory does not use the memory cell, data of which read by the writing/reading circuit at the time of the initial test does not coincide with the programmed program data, at a time of normal use after the initial test.

5. The semiconductor memory according to claim 1, wherein each of the memory cells comprises a first inverter and a second inverter that are configured from a MOS transistor and are cross-coupled, and, a threshold of the MOS transistor of either the first inverter or the second inverter is shifted by being applied a stress according to the written inverted data of the program data, and the stress is applied such that a shift amount of the threshold of the MOS transistor becomes smaller than a maximum shift amount of the threshold of the MOS transistor.

6. The semiconductor memory according to claim 5, wherein the writing/reading circuit overwrites the memory cell in which the program data has been programmed.

\* \* \* \* \*